(12) United States Patent
Novotny

(10) Patent No.: US 11,605,794 B2
(45) Date of Patent: Mar. 14, 2023

(54) MATERIALS AND DEVICES THAT PROVIDE TOTAL TRANSMISSION OF ELECTRONS WITHOUT BALLISTIC PROPAGATION AND METHODS OF DEVISING SAME

(71) Applicant: Mark A. Novotny, Columbus, MS (US)

(72) Inventor: Mark A. Novotny, Columbus, MS (US)

(*) Notice: Subject to any disclaimer, the term of this patent is extended or adjusted under 35 U.S.C. 154(b) by 31 days.

(21) Appl. No.: 17/078,069

(22) Filed: Oct. 22, 2020

(65) Prior Publication Data

US 2021/0119158 A1 Apr. 22, 2021

Related U.S. Application Data

(63) Continuation-in-part of application No. 15/519,705, filed as application No. PCT/US2015/000114 on Oct. 19, 2015, now abandoned.

(60) Provisional application No. 62/177,918, filed on Mar. 27, 2015, provisional application No. 62/122,343, filed on Oct. 17, 2014.

(51) Int. Cl.
*H01L 21/00* (2006.01)
*H01L 51/00* (2006.01)
*H01L 51/05* (2006.01)

(52) U.S. Cl.
CPC ...... *H01L 51/0558* (2013.01); *H01L 51/0048* (2013.01); *H01L 51/0545* (2013.01)

(58) Field of Classification Search
CPC .................................................. H01L 51/0048
See application file for complete search history.

(56) References Cited

U.S. PATENT DOCUMENTS

| | | | | |
|---|---|---|---|---|
| 5,087,948 A * | 2/1992 | Phillips | ...................... | H03H 2/00 257/432 |
| 8,754,397 B2 * | 6/2014 | Kastalsky | ............. | H01L 51/057 257/29 |
| 9,310,326 B2 * | 4/2016 | Jeong | ...................... | G01N 27/00 |
| 9,659,734 B2 * | 5/2017 | Duncan | .................... | H01J 3/021 |
| 2005/0029498 A1 * | 2/2005 | Elkovitch | ................ | H01B 1/24 252/500 |
| 2006/0012000 A1 * | 1/2006 | Estes | ...................... | B82Y 20/00 257/E29.241 |
| 2006/0158760 A1 * | 7/2006 | Portico Ambrosio | . | B82Y 10/00 359/883 |
| 2008/0218074 A1 * | 9/2008 | Kastalsky | ................. | H01S 5/30 977/700 |

(Continued)

*Primary Examiner* — Nicholas J Tobergte
(74) *Attorney, Agent, or Firm* — Conley Rose, P.C.

(57) ABSTRACT

Quantum dragon materials and devices have unit (total) transmission of electrons for a wide range of electron energies, even though the electrons do not undergo ballistic propagation, when connected optimally to at least two external leads. Quantum dragon materials and devices, as well as those that are nearly quantum dragons, enable embodiments as quantum dragon electronic or optoelectronic devices, including field effect transistors (FETs), sensors, injectors for spin-polarized currents, wires having integral multiples of the conductance quantum, and wires with zero electrical resistance. Methods of devising such quantum dragon materials and devices are also disclosed.

34 Claims, 22 Drawing Sheets
(20 of 22 Drawing Sheet(s) Filed in Color)

(56) References Cited

U.S. PATENT DOCUMENTS

| | | | | |
|---|---|---|---|---|
| 2013/0146836 A1* | 6/2013 | Kastalsky | ........... | H01L 51/0048 |
| | | | | 257/29 |
| 2013/0217565 A1* | 8/2013 | Kastalsky | .............. | B01J 37/023 |
| | | | | 977/773 |
| 2013/0334047 A1* | 12/2013 | Jeong | ............... | G01N 33/48721 |
| | | | | 204/603 |
| 2014/0154847 A1* | 6/2014 | Kastalsky | ............... | H01L 29/45 |
| | | | | 438/167 |
| 2017/0331037 A1* | 11/2017 | Novotny | ......... | H01L 31/035227 |

* cited by examiner

MATERIALS AND DEVICES THAT PROVIDE TOTAL TRANSMISSION OF ELECTRONS WITHOUT BALLISTIC PROPAGATION AND METHODS OF DEVISING SAME

CROSS-REFERENCES TO RELATED APPLICATIONS

This application claims priority to and the benefit of and is a continuation-in-part of U.S. national stage patent application Ser. No. 15/519,705, filed Apr. 17, 2017, and entitled "Materials and Devices that Provide Total Transmission of Electrons without Ballistic Propagation and Methods of Devising Same", from PCT/US15/00114, filed Oct. 19, 2015, of the same title, and which claims priority to and the benefit of U.S. Provisional Patent Application Ser. No. 62/122,343, filed Oct. 17, 2014, and entitled "Method for Obtaining Unit Transmission in Nanodevice Electron Propagation: Full Transmission without Ballistic Propagation" and U.S. Provisional Patent Application Ser. No. 62/177,918, filed Mar. 27, 2015, and entitled "Method for Obtaining Unit Transmission in Nanodevice Electron Propagation: Full Transmission without Ballistic Propagation and Associated Field-Effect Transistors", which applications are hereby fully incorporated in their entireties by their reference herein.

STATEMENT OF GOVERNMENT SUPPORT

This invention was made with government support under grant DMR-1206233 awarded by the National Science Foundation. The government has certain rights in the invention.

FIELD OF THE INVENTION

The present invention relates to the transmission of electrons in electronic and optoelectronic devices. More specifically, the invention provides novel quantum dragon materials and devices that provide total or unit transmission of electrons and methods of devising such materials and devices. In addition, the invention provides means of devising materials and devices based on the concept of being nearly a quantum dragon wherein the transmission of electrons is nearly total.

Ballistic propagation of electrons occurs when there is no disorder in a material, leading to unit transmission (total or 100% transmission) of electrons. Ballistic propagation allows for the minimum electrical resistance of wires and devices, such as field effect transistors (FETs). The same effects can be obtained with disordered or partially-disordered materials, leading to the same total transmission property for electrons that do not undergo ballistic propagation. The disorder must be tuned fairly precisely for total transmission, leading to a requirement of strict control over devices such as wires, nanowires, molecular devices, and other electronic and optoelectronic devices. The present invention discloses quantum dragon materials and devices and systems, as well as methods for obtaining total electron transmission via such materials and devices. Nearly ballistic devices have electron transmission reasonably large (greater than 50%), and similarly nearly quantum dragon devices have electron transmission very large (greater than 50%). Electronic devices based on quantum dragon materials and nearly quantum dragon materials include, for example, FETs, sensors, optoelectronic devices, and devices that inject spin-polarized electric currents into other devices.

BACKGROUND OF THE INVENTION

Anderson localization [Anderson 1958] states that, in one dimension (1D), any system with randomness has its quantum wavefunction localized. Transport through nanosystems is calculated using the Landauer formula for electric voltages and electric currents from quantum transmission [Landauer 1957]. The term 1D includes long systems that have a small cross section (of any shape) perpendicular to the long direction, such as a wire. The combination of Anderson localization and the Landauer formula gives the intuition and current standard assumption that any disordered 1D device should act as an insulator since its electron transmission will be typically much smaller than 1%. Conversely, ballistic electron propagation occurs when there is no disorder and gives the transmission probability T as a function of the energy E of the incoming electron to be $T(E)=1$ or 100%. This total transmission occurs for a wide range of energies and, for ballistic propagation, the range is determined by the leads connected to the 1D device. A ballistic material is a perfect conductor (at low temperatures, at least within the single-band tight-binding model), having zero electrical resistance in a four-probe measurement. A ballistic material when measured in a two-probe measurement has an electrical conductance $G_0 = 2e^2/h$, where e is the charge of an electron and h is Planck's constant. $G_0$ is often called the conductance quantum. Anderson localization gives $T(E)$ extremely small for all energies, so the material is an insulator and would have the electrical conductance G extremely large (in both two-probe and four-probe measurements). Ballistic propagation is due to the coherent nature of the electrons propagating through the material.

Certain ordered 1D systems have also been shown to have total electron transmission of $T(E)=1$ and hence have been dubbed by researchers to have ballistic electron propagation. The known materials to have been reported to have ballistic propagation include single-walled carbon nanotubes in the armchair arrangement, carbon nano-ribbons, and semiconducting materials with extremely long electron mean-free paths due to lack of significant disorder. The addition of a little bit of disorder leads to devices that are nearly ballistic. Field Effect Transistors (FETs) and other electronic or optoelectronic devices based on these known $T(E)=1$ materials have been constructed, measured, patented, and manufactured.

Consider a material or device connected to electrical leads, with the leads connected to macroscopically large sources and sinks of electrons. The arrangement is sketched in the top part of FIG. 1. For coherent electron transport, of central importance in the calculation of the electrical conductance G for a device or nanodevice is the transmission probability $T(E)$ for an electron with energy E. The electrical voltage V across the device is given by $$V = \frac{\int dE(-df/dE)(1 - T(E))}{e \int dE(-df/dE)} (\mu 1 - \mu 2) \quad (1)$$

where e is the charge of the electron. The chemical potential of the macroscopic source and drain of electrons are μ1 and μ2. The typically valid assumption that the velocity of the electrons have a negligible energy dependence within the range where df/dE is appreciable has been made. The function $f$ is the equilibrium Fermi function at the temperature of the material. This is Eq. (2.7) of the article [Büttiker 1985]. The electric current I that flows through the material is proportional to the difference in the chemical potentials, I∝μ1−μ2. In the normal fashion the electrical conductance G, which is the inverse of the electrical resistance, is given by Ohm's law, I=V G. The transmission T for a particular energy E of the incoming electron is given by the solution of the time-independent Schrödinger equation for any model calculation.

Consider the case where there is no disorder to scatter the electrons. The electrons then undergo ballistic propagation, because there is no disorder to modify their initial trajectory. More accurately, there is a Bloch wavefunction which utilizes the periodicity of the device to give ballistic propagation. For ballistic propagation, no matter the energy of the incoming electron it will be transmitted through the material. In terms of formulas, for ballistic propagation T(E)=1. In other words, ballistic propagation has unit (total) transmission (100% transmission) of electrons for all energies. From Equation (1) it looks like the voltage dropped across the material should then be zero. However, care must be taken in the analysis of the problem due to the contact resistance between the leads and the macroscopic electron source and sink [Bagwell 1989]. Following [Bagwell 1989], the current of electrons of energy E in a two-probe measurement is (E)=$G_0$ V T(E) in terms of the voltage in Equation (1), this is Equation 8 of [Bagwell 1989]. Alternatively, in a four-probe measurement the electric current is I(E)=$G_0$VT(E)/(1−T(E)), which is Equation 9 of [Bagwell 1989]. Hence it is predicted [Bagwell 1989] that for ballistic propagation in a four-probe measurement the electrical resistance is indeed zero, so the electrical conductance is G=∞. However, in a two-probe measurement the conductance for a material with one open electron channel when the electrons undergo ballistic propagation is G=$G_0$. Experimentally on the same ballistic quantum semiconducting device the two different values of electrical conductance (G=∞ and G=n $G_0$ with n an integer, n≥1) were measured in 2001 [De Picciotto 2001].

In order to calculate the conductance one must calculate T(E), the solution of the time-independent Schrödinger equation of the device with the attached extremely long (semi-infinite) leads. The leads are in turn attached to a macroscopic source and sink of electrons, at chemical potentials μ1 and μ2 [Landuaer 1957, Bagwell 1989, Datta 1995]. The experimental or theoretical setup is shown in the top part of FIG. 1. One normal model to study is the tight-binding model [Datta 1995, Hirose 2014], for example see the application to graphene nanoribbon junctions [Wu 2011]. Consider the tight-binding model for a nanoscale material, and for leads one atom in width (a single electron channel). The model is more general in that it is applicable to a wider range of physical devices, but for ease of explanation this nanoscale picture will be used. The tight-binding model has as a set of parameters the on-site energy $\varepsilon_j$ for the atomic position labeled by the index j. The on-site energies include both contributions from the discretization of the Schrödinger equation and from the electrical potential at the site [Datta 1995, et al.]. The tight-binding model also includes as parameters hopping terms $-t_{i,j}$ between atoms labeled by the indices i and j. The hopping terms are due to the wavefunction overlap between two atoms, and are typically negative since they come from the kinetic energy term of the Schrödinger equation [Datta 1995, Hirose 2014, et al.]. The tight-binding model can also be a course-grained model, with effective values of $\varepsilon_j$ and $-t_{i,j}$ between volumes that include many atoms. Every atom in the semi-infinite leads is identical, so it is traditional to take the zero of energy to be the value of $\varepsilon_{j,Leads}$ for the lead atoms, and $t_{i,j:Leads}$=1 between lead atoms as the unit of energy, and this convention will be used here. The Schrödinger equation to solve for the tight-binding model is represented as an infinite matrix equation, due to the two semi-infinite leads. One traditional method of solution involves the use of the NEFG (Non-Equilibrium Green's Function) methodology [Datta 1995, Wu 2011, Hirose 2014]. An alternative way of calculating T(E), using an ansatz for the solution of the matrix equation, was given by [Daboul 2000]. They find that, after using an ansatz for the solution of the time-independent Schrödinger equation for the semi-infinite leads, the transmission is given by the solution of a finite matrix equation of the form $$N_{Full}\vec{\Psi} = \begin{pmatrix} \zeta & \vec{w}^\dagger & 0 \\ \vec{w} & F_{Full} & \vec{u} \\ 0 & \vec{u}^\dagger & \zeta \end{pmatrix} \begin{pmatrix} r \\ \vec{\psi} \\ t_T \end{pmatrix} = \begin{pmatrix} \Xi \\ \vec{0} \\ 0 \end{pmatrix} \quad (2)$$

where the vector $\vec{w}$ contains the hopping terms between the input lead and the device, while the vector u contains the hopping terms between the output lead and the device. Input leads and output leads have one terminal per lead. The Hermitian matrix $F_{Full}$, has elements of the tight-binding parameters within the device and the energy E of the incoming electron, and if the material between the leads has M atoms the matrix is M×M. The quantity $\zeta(E)=(-E-i\sqrt{4-E^2})/2$ with $i=\sqrt{-1}$, and $\Xi(E)$ is −2i times the imaginary part of $\zeta(E)$. All electrons in the range −2≤E≤2 propagate through the leads. The wavefunction for the device is the vector $\vec{\psi}$, with a length of M. The dagger superscript represents the Hermitian conjugate of a vector or matrix, so $\vec{w}$ is a column vector and $\vec{w}^\dagger$ is the row vector that is its Hermitian conjugate. Here $\vec{0}$ is a vector of zeros of the appropriate size, while 0 is the number zero. All matrices are written in bold. The electron transmission through the device, for an electron of energy E emitted from the macroscopic electron sink, is given by T(E)=$|t_T(E)|^2$.

As stated above, Anderson localization [Anderson 1958] states that, in one dimension (1D), any quantum system with randomness has its wavefunction localized. See for example the review article by [Lagendijk 2009]. The term 1D is taken to include long systems that have a small cross section (of any shape) perpendicular to the long direction, such as a wire. Any material with Anderson localization will have an extremely small transmission T(E), a very small electric current I, and a very large electrical resistance (a very small electrical conductance G). By studying the 2D (two dimensional) tight-binding model with random parameters, it was found by [Lee 1985] that all systems with uncorrelated randomness in 2D also exhibit Anderson localization, and hence all have a very small G. In 3D (three dimensions), Anderson localization only occurs above a certain threshold of the strength of the disorder when there is uncorrelated randomness in the system.

The combination of Anderson localization and the Landauer formula gives the intuition and current standard assumption that any disordered 1D device should act as an insulator, namely G should be very small. Indeed this assumption is true for all systems with uncorrelated disorder.

Technologies involving ballistic propagation, and nearly ballistic propagation, in electronics and optoelectronics include:
- U.S. Pat. No. 9,024,297, entitled "Two- and Three-Terminal Molecular Electronic Devices with Ballistic Electron Transport", (McCreery, at al.);
- U.S. Patent Publication No. 2013/0181189, entitled "Logic Elements Comprising Carbon Nanotube Field Effect Transistor (CNTFET) Devices and Methods of Making Same", (Bertin);
- U.S. Pat. No. 8,754,397, entitled "CNT-Based Electronic and Photonic Devices", (Kastalsky);
- U.S. Pat. No. 8,778,716, entitled "Integrated Circuits Based on Aligned Nanotubes", (Zhou, et al.; and
- U.S. Pat. No. 8,419,885, entitled "Method of Bonding Carbon Nanotubes", (Fisher, et al.).

Also, a review of nanotube electronic devices can be found in [Anantram 2006]. A review of Anderson localization in nanotubes can be found in [Flores 2008].

These references relate to electronic and optoelectronic ballistic propagation and do not involve quantum dragon materials or devices or the methods to devise such devices. The present invention provides novel materials and devices comprising quantum dragon materials and devices that allow total transmission of electrons through an electrical or optoelectrical device, for example, without ballistic propagation. Moreover, the invention provides methods of devising and obtaining such materials and devices.

Previous publications also relate to quantum dragon materials and devices, but are distinguished from the present invention.

Research on quantum dragons has been published as M. A. Novotny, *Physical Review B*, volume 90, article 165103 [14 pages] (2014), including the supplemental material [67 pages][Novotny 2014]. Another publication was an abstract and preprint posted on-line and submitted to a journal as M. A. Novotny, preprint http://arXiv.org/abs/1502.07814 [14 pages] [Novotny 2015]. A Mississippi State University Masters of Science degree thesis concerning quantum dragon research is entitled as Z. Li, *Multi-channel quantum dragons in rectangular nanotubes*, M. S. thesis, Mississippi State University, May 2015 [Li 2015]. A description of each publication and details of how each is different from the present invention and technology is given below, in order of the publications.

[Novotny 2014] first presents the mathematical method of solving the time-independent Schrödinger equation by mapping it onto a one-dimensional system and then tuning the original parameters so that the mapped system looks like a short circuit to give T(E)=1. All systems studied in [Novotny 2014] had axial symmetry, i.e. they were shaped like a tube. For axial symmetry, the mapping equations are much easier to find than for general systems, for the axial symmetry requires that the lead atoms be placed along the axis of symmetry. Furthermore, it was stated in the conclusions that "[i]t is anticipated that quantum dragons will have similar technological applications as do ballistic electron propagation devices". The fact that axial quantum dragon nanodevices will have zero electrical resistance in a four-probe measurement and an electrical conductance $G_0$ in a two-probe measurement was stated. The analysis was performed with leads one atom thick, both for leads with uniform hopping and for leads with hopping ratio of even-of-odd and odd-to-even atoms but all with zero on-site energies.

The present invention expands on previous technology by disclosing novel quantum dragon materials and devices and methods to devise the same and further involves embodiments not a part of the publications including, but not limited to, effects of magnetic fields on the materials and devices, spin-polarized electric current injectors, quantum dragon efficient FETs, the effect of shape and/or connections and atomic locations on efficiency, such as the beneficial results of an eye-glass shape, analysis in terms of center-of-mass location of lead-to-slice hopping terms, the construction of quantum dragon sensors, an electronic nose, quantum dragons made from BCC crystals, and mapping and tuning of quantum dragons. In addition, all of these quantum dragon materials and devices can function when they have large electron transmissions (generally larger than 50%).

SUMMARY OF THE INVENTION

The present invention provides quantum dragon materials and devices having unit or total transmission of electrons for a wide range of electron energies. The electrons transmitted by and through these materials and devices made of such materials do not undergo ballistic propagation, when connected optimally to at least two external electrical leads. Quantum dragon materials and devices enable embodiments as quantum dragon electronic or optoelectronic devices, which includes, but is not limited to, field effect transistors (FETs), sensors, injectors for spin-polarized currents, wires having integral multiples of the conductance quantum, and wires with zero electrical resistance.

The invention further provides methods for devising such quantum dragon materials and devices and for obtaining complete electron transmission without ballistic propagation utilizing the novel quantum dragon materials and devices and electronic devices based on the quantum dragon materials. A device with strong disorder and average transmission greater than 50% will be deemed to be nearly a quantum dragon, and the efficiency of such devices will not be significantly affected by the transmission being large but not 100%.

With the foregoing and other objects, features, and advantages of the present invention that will become apparent hereinafter, the nature of the invention may be more clearly understood by reference to the following detailed description of the preferred embodiments of the invention and to the appended claims.

BRIEF DESCRIPTION OF THE DRAWINGS

The paten or application file contains at least one drawing executed in color. Copies of this patent or patent application publication with color drawing(s) will be provided by the Office upon request and payment of the necessary fee. These drawings accompany the detailed description of the invention and are intended to illustrate further the invention and its advantages.

DETAILED DESCRIPTION OF THE INVENTION

Figure 1:
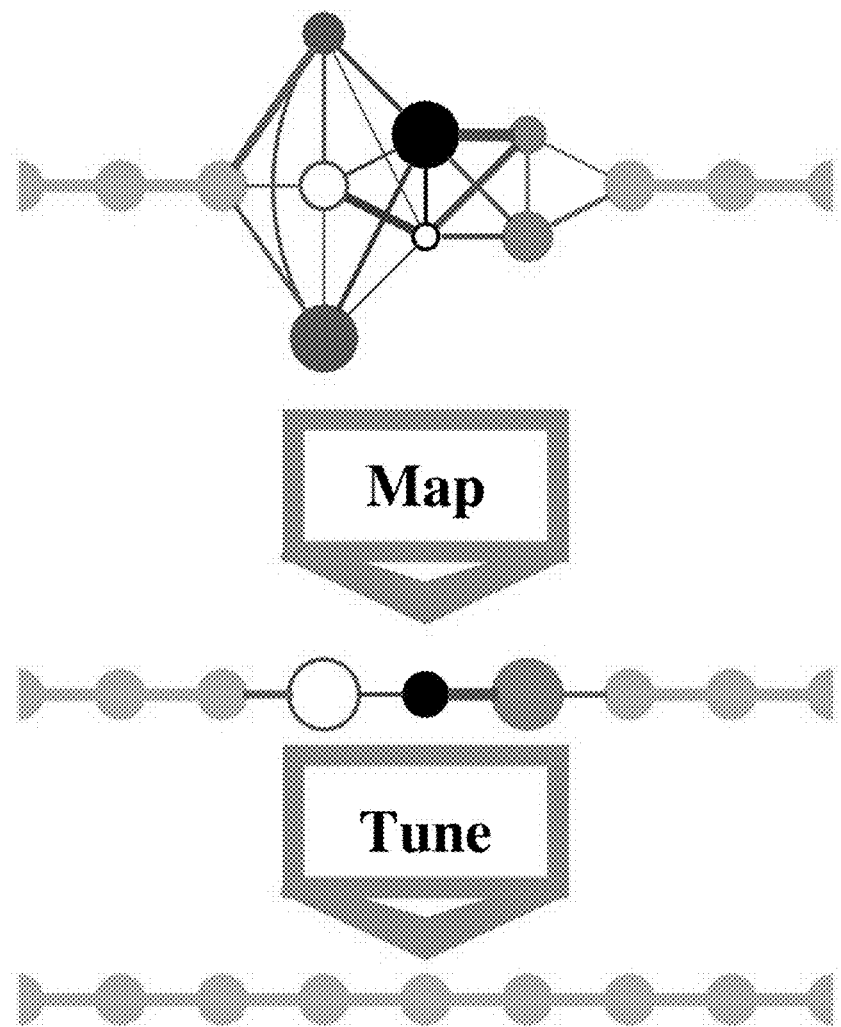
FIG. 1 depicts an illustration of the methodology to devise quantum dragons of the present invention.

Current technology provides that only systems without disorder, namely ballistic propagation materials, can have total electron transmission or $T(E)=1$. The current invention provides disordered systems that can have total electron transmission such that $T(E)=1$. These systems are termed "quantum dragons." Quantum dragons may be incorporated into electronic or optoelectronic devices, thin wires and/or ribbons. The novel devices also include electronic or optoelectronic sensors based on quantum dragon properties, FETs that at some region of their normal operation operate at or near the quantum dragon $T(E)=1$ point, and/or devices to obtain spin-polarized electron currents based on quantum dragon properties.

The present invention provides that, with correlated disorder (as opposed to random disorder), Anderson localization in 1D materials can be circumvented. When Anderson localization is overcome, the material and device can have the same physical electrical behavior as a ballistic electron device with $T(E)=1$. For example, a quantum dragon material is a perfect electrical conductor, since in a four-probe measurement the electrical conductance $G=\infty$ (at least at low temperatures and within the single-band tight-binding description), in accordance with the Landauer formula [Landauer 1957]. Quantum dragon materials are shown to exist only on particular low-dimensional parameter subspaces within the high dimensional parameter space of on-site energies and hopping parameters of the tight-binding model appropriate for a material or device. On these low-dimensional parameter spaces, electron scattering will be present and may be arbitrarily strong, but the correlation between the physical parameters gives total electron transmission for all energies, i.e. gives $T(E)=1$. The low dimensional parameter space of quantum dragons includes materials with correlated disorder, as well as materials that have some regularity, such as semi-regular crystal structures or semi-regular tube-like structures.

The detailed descriptions of the Figures that follow are merely illustrative in nature and are not intended to limit the embodiments of the subject matter or the application and uses of such embodiments. Specific implementations described herein are not necessarily to be construed as advantageous or preferred over any other implementation. In addition, there is no intention to be bound by anything implied or expressed or theory presented in the preceding technical field, background, brief summary, or the detailed descriptions of the Figures. The Figures are sketches and embodiments of quantum dragon devices. The Figures are described in detail herein in order not to detract from the general specifications described herein, and the claims involving the quantum dragon materials and devices and methods are the general claims and not the specific claims of a particular figure.

For clarity as well as for simplicity of illustration, the Figures depict the sketch of the general structure and/or manner of construction of the various embodiments. Details and descriptions of well-known or obvious features and techniques may be omitted in order to avoid unnecessarily obscuring other features. Elements in the drawings of the Figures are not meant to be necessarily drawn to scale; for example, the sizes of some features may be exaggerated relative to other elements in order to assist in improving the understanding of the embodiments in the examples.

The Figures may be in color, whereby the colors present the invention more clearly. However, no essential features are missed or absent if the figures are without color and depicted in black and white. Descriptions are given so they can be read independent of the colors. Any reference to a particular color will be given in square brackets, such as [pink], and these terms in the square brackets may be ignored if the figures are not in color.

Quantum dragon materials and devices enable electronic and optoelectronic applications in the same instances that ballistic electron propagation would allow such devices. This includes disordered or partially-ordered materials or materials on a scale of from about nanometers to about micrometers, but includes any size scale, that are perfect electrical conductors. In addition, quantum dragon devices have the same properties as ballistic propagation, leading to effects that include pinch-off field-effect transistors (junctionless or with a junction) (POFETs), ballistic FETs [Chuang 2013], and Quantum Interference Effect Transistors (QuIETs) [Cardamone 2002]. Novel quantum dragon materials and devices of the invention also enable some electronic and optoelectronic devices where ballistic propagation (no disorder) does not exist and hence could not enable such devices. These quantum dragon electronic and optoelectronic devices include sensors, for example, to measure electric and/or magnetic fields or electromagnetic radiation in or near a quantum dragon device of the invention. Another example or embodiment of a quantum dragon device based on properties of quantum dragon materials is a device designed to obtain spin-polarized electric currents. All of these devices which have been fashioned from ordered materials with ballistic or nearly ballistic electron transmission can similarly be fashioned from disordered quantum dragon nanomaterials or nearly quantum dragon nanomaterials.

Quantum Dragon Devices Differ from Ballistic Devices

The basis of the present invention arises out of solutions for the time-independent Schrödinger equation for a wide class of systems, including systems having arbitrarily strong disorder, but the disorder must be correlated. Furthermore, these exact solutions allow one to solve for many materials and devices that have total electron transmission for all energies, $T(E)=1$. These systems may have arbitrarily strong disorder and may be 2D or 3D or 2D+3D systems. The reason they do not undergo Anderson localization is because the disorder in the device is correlated disorder. In other words, not all values of the tight-binding parameters are independent, but must satisfy particular relationships described below. These devices have been named by the inventor as quantum dragons and the materials as quantum dragon materials. Quantum dragon materials/devices have total transmission for all energies, $T(E)=1$, just as do systems with ballistic transport. Similarly, nearly quantum dragon materials/devices have transmission for all energies, $T(E)$ larger than 50%, just as do systems with nearly ballistic transport. However, ballistic transport has zero electron scattering (no disorder), while quantum dragons can be regular systems or can have strong scattering (strong, but correlated, disorder). In other words, all devices with ballistic electron transport have $T(E)=1$ and no scattering, while quantum dragon systems have $T(E)=1$ but may have strong scattering. As given by Equation (1), the electric properties of the device will be the same when $T(E)=1$, whether the device is a quantum dragon device or a ballistic device. The present invention does not involve any device that has previously been labeled as having ballistic electron transport because it had $T(E)=1$, but does involve and disclose all other materials and devices that do not have ballistic electron transport or propagation but have $T(E)=1$.

The distinction between quantum dragon behavior and ballistic propagation for electron transport is important and is further detailed herein. This distinction is particularly important since devices based on ballistic electron propagation have been described in the literature and patented and are existing technology. Ballistic electron propagation occurs when there is no scattering of the electrons, or where the amount of scattering is so small as to be negligible because the electron mean-free-path between scattering events is longer than, and as compared to, the dimensions of the device. In ballistic electron propagation, all electrons are transmitted, so for all energies $T(E)=1$. Although all devices with ballistic electron propagation have $T(E)=1$, not all devices with $T(E)=1$ are devices with ballistic propagation. Devices with appreciable amounts of scattering, and with arbitrarily large amounts of scattering, can have $T(E)=1$. Quantum dragon devices are those with $T(E)=1$, but do not have ballistic electron propagation because the electrons undergo appreciable scattering. All electronic and optoelectronic devices enabled by quantum dragon electron transport are encompassed herein, while devices based on ballistic electron transport are existing technology. Due to the subtle distinctions between ballistic behavior and quantum dragon behavior, devices based on materials described prior to about 2015 in journals or patents, for example, as ballistic are not encompassed by the materials, devices, and methodologies of the present invention. Devices that do not have ballistic electron transport and that have any amount of non-negligible scattering, but have $T(E)=1$, are quantum dragon devices encompassed by the present invention.

$T(E)=1$ Defined

The equation $T(E)=1$ requires some quantification and specification. The first is that this equation is strictly valid only at zero degrees Kelvin. At zero degrees Kelvin, the $-df/dE$ term in Equation (1), which is the derivative of the Fermi function $f(E)$ with respect to the energy E, becomes a delta function centered at the Fermi energy (the energy of the highest filled electronic orbital at zero degrees Kelvin). At temperatures above zero degrees Kelvin, this derivative has some width and, if $T(E)$ is not equal to unity, the integral in Equation (1) must be integrated over temperature, but nevertheless the derivative is close to a delta function. Furthermore, as will be described below, only certain regions of parameter space have $T(E)=1$. Therefore, the statements $T(E)=1$, or unit transmission, or total transmission, or 100% transmission will be defined as and taken to actually mean 'there is a wide range of electron energies E that have a transmission probability T greater than or equal to about 85%'. For nearly ballistic or nearly quantum dragon nanodevices, the transmission probability T is greater than or equal to about 50%. The next quantification is concerning the definition of 'a wide range of electron energies'. Consider first idealized leads with a thickness of one atom, as in the leads shown in the top of FIG. 1. These leads are taken to be long (semi-infinite). Within the tight-binding model, there is a hopping parameter $t_{i,j:Leads}$ (usually taken as the unit for energy in the problem) for the hopping from one lead atom to the next lead atom. Assuming the zero of energy is assigned so the lead atoms have $\varepsilon_{j,Leads}=0$, only electrons in the range parameter $-2\ t_{i,j:Leads} \leq E \leq 2\ t_{i,j:Leads}$ propagate through the leads. Hence even for a ballistic device only electrons with energies in the range $-2\ t_{i,j:Leads} \leq E \leq 2\ t_{i,j:Leads}$. As propagate through the ballistic nanodevice, and hence $T(E)=1$ only for this wide range of energies. If the leads have a more complicated structure, for example if every fourth lead atom has a different hopping value or a different on-site energy, only electrons given by some typically complicated function will propagate through the leads, and there will be typically a series of energy ranges, often separated by energy ranges where $T(E)=0$ at zero degrees Kelvin, such that for continuous energies in the range $E_{lower} \leq E \leq E_{upper}$ one has $T(E)=1$ for a ballistic device or nanodevice connected to these types of leads. Furthermore, if the thickness of the semi-infinite wires is greater than one atom wide, similar continuous ranges of energy $T(E)=1$ exist. These energy ranges with continuous $T(E)=1$ are the same (almost always) for a ballistic device connected to the leads or for no device at all, a single continuous lead (a short circuit in a classical wire). Therefore, the precise definition of 'for a wide range of energies' shall mean 'depending on the particular types of leads, at least about 25% of any energy range $E_{lower} \leq E \leq E_{upper}$ wherein one has T(E)=1 for the input and output leads directly connected to each other, and wherein the width of the energy range $E_{upper}-E_{lower}$ is greater than or equal to one femtoVolt ($10^{-15}$ Volts)'.

FIG. 1 sketches and shows the methodology used to locate quantum dragon materials and/or quantum dragon devices. The circles (either filled or open) have an on-site energy in the tight-binding model of $\varepsilon_k$ for the circle labeled by the index k. The lines (either solid or dashed, straight or curved) represent the hopping terms within the tight-binding model, with the term $t_{j,k}$ the hopping term between circles labeled by the indices j and k. In nanosystems the circles represent the location of atomic nuclei and the hopping terms are due to the wavefunction overlap between two atoms. However, the tight-binding model can also be a course-grained model, with each circle representing many atoms and each line representing an effective hopping interaction. Long (semi-infinite) input and output electrical leads 100 are connected to the device, here shown by two and one-half [cyan] circles. The device sketched here is in 2D (two dimensions), but in general can be in 3D (three dimensions) or a combination 2D+3D. The device sketched in the top part of FIG. 1 is comprised of seven circles, and may be envisioned to be made of three vertical slices from left to right having 3 [red], 2 [black], and 2 [magneta]circles. In general, the on-site energies within a slice can all be different and the hopping terms between circles can all be different. As described in the detailed description of the invention, solving for the transmission probability T(E) as a function of the energy E of the incoming electron requires solving the time-independent Schrödinger equation, which in general is not possible for very large numbers of circles when the material has disorder. The model has a high dimensional parameter space, with the dimension given by the number of different circles plus the number of different line segments in the device or going between the device and the leads. Although it is not possible to solve the time-independent Schrödinger equation for all points in the high dimensional parameter space, the inventor has been able to devise an exact mapping wherein for some lower dimensional parameter subspace the original model projects onto a 1D system (middle part of the figure), with the circles now being composites of the circles and line segments within each slice. Similar is the case for the mapped line segments between the mapped circles between the mapped circles and the lead circles. Tuning parameters within the original problem allows each mapped circle and each mapped line segment to be identical to those of the leads 100 (bottom part of the figure). There is no disorder in the bottom part of the figure, due to the tuning to correlate the disorder in the top part of the figure. Hence for incoming electrons the device looks like a short circuit. The short circuit, due to lack of scattering in the bottom part of the figure, has total transmission of incoming electrons of all energies, T(E)=1. Note that there is very strong scattering possible in the top part of the figure. However, by correlating the scattering due to the disorder, the electrons see the device to be equivalent to the bottom part of the figure. An alternative method of devising the mapping has been given by the inventor as a quantum dragon nanodevice with disorder where a unitary transformation in the associated Hilbert space of the Hamiltonian leads to a uniform wire of the composite physical degrees of freedom, as well as a large disconnected part formed by the remaining composite degrees of freedom.

Generally Devising a Quantum Dragon

A quantum dragon device is a device (sometimes herein called a nanodevice because they may be as small as on the scale of nanometers) comprised in whole or in part of at least one quantum dragon material where, for a wide range of energies, all electrons that impinge on the device are transmitted through the device so that T(E)=1. A quantum dragon is an arrangement of atoms that can be tuned to increase electron transmission by connecting leads to appropriate or optimized attachment points by known electrical connection methods. The device is made of different groupings of atoms that are called "slices" (defined more precisely below). To make or construct a quantum dragon, the practitioner must calculate where to connect the at least two leads to the atoms of the material connected by the leads. The device thereby consists of at least two long leads (sometimes herein termed semi-infinite leads) and the material connected to the at least two leads. The material connected to the leads may have its narrowest width anywhere within the range of about one nanometer to about one or typically ten micrometers, but is applicable to any size scale. A practitioner skilled in the art may also effectively estimate approximately where the two leads must be connected to the atoms of the material that is inserted between the semi-infinite leads. If leads are attached in a non-optimal fashion, the electron transmission can be improved by applying appropriate electric and/or magnetic fields, manipulating the lead attachment bond strength, manipulating the shape of the slices or the location of the atoms in the material that is connected by the leads, and/or by applying pressure or strain to the material connected to the at least two leads.

Calculating How to Connect Two Leads to Devise a Quantum Dragon: Mapping

The Schrödinger equation is used to calculate the transmission probability of the electrons and the appropriate lead attachment points. The exact solution to the time-independent Schrödinger equation and the location in parameter space with quantum dragon materials and devices was found by following the mathematics in the schematic in FIG. 1. The first step is to find a mapping from the original device onto a one-dimensional equivalent mapped system. This is equivalent to finding a suitable unitary transformation of the Hilbert space of the device Hamiltonian. If the leads are more than one atom thick, the mapping described herein may be generalized to still yield quantum dragon devices, but the simplest leads and hence the simplest mapping is described herein. The mapping is accomplished by introducing a unitary transformation matrix $X_{Full}$ to transform the matrix in Equation (2) into a matrix of the form $$\begin{pmatrix} \zeta & \vec{w}^\dagger X_{Full}^\dagger & 0 \\ X_{Full}\vec{w} & X_{Full}F_{Full}X_{Full}^\dagger & X_{Full}\vec{u} \\ 0 & \vec{u}^\dagger X_{Full}^\dagger & \zeta \end{pmatrix} \begin{pmatrix} r \\ X_{Full}\vec{\psi} \\ t_T \end{pmatrix} = \begin{pmatrix} \Xi \\ \vec{0} \\ 0 \end{pmatrix}. \quad (3)$$

One has complete freedom to choose the transformation matrices $X_{Full}$. Consider any device comprised of l slices, with hopping allowed only between atoms within the same slice or from one slice to the neighboring slice. An example is sketched in FIG. 1 for l=3. The slices may be physical (for example all atoms in a particular plane) or just a mathematical convenience (for example, for a device with l=2, slice one could be all atoms to the left of an arbitrarily chosen value and slice two could be all atoms to the right of this value). The inventor discovered a set of matrix equations relating $X_{Full}$ and $F_{Full}$ which, when satisfied, map the transformed matrix onto a smaller matrix, while keeping the electron transmission $T(E)=|t_T(E)|^2$ unchanged. As sketched in FIG. 1, the original problem is thereby exactly mapped (via a many-to-one mapping) onto a 1D problem with disorder. The precise form of this mapping is described below. By tuning a small number of the tight-binding parameters in the original nanodevice, the mapped on-site energies become zero and the mapped hopping parameters all become unitary. In other words, the mapped and tuned equation looks to the incoming electrons as a short circuit. As depicted in the bottom part of FIG. 1, this means for all energies $T(E)=1$, namely the material is a quantum dragon because it has total transmission for all electron energies.

Consider a system with l slices wherein for a nanomaterial the atoms are grouped into one or more slices wherein each slice only has connections to leads and to adjacent slices, as in a 1D formulation. The connections from the input lead to the atoms in the material inserted between the leads will herein for simplicity be to atoms which are all in the first slice. Similarly, the output lead is connected to atoms which are all in the last slice. The input lead and output lead each has one terminal. The consideration of slices does not restrict the material, but rather is a convenient mathematical consideration. We will write equations for three slices, l=3, as in FIG. 1, but the reasoning is valid and the mathematics easily generalizable for any number of slices. The full transformation matrix is chosen to have the block diagonal form $$X_{Full} = \begin{pmatrix} X_1 & 0 & 0 \\ 0 & X_2 & 0 \\ 0 & 0 & X_3 \end{pmatrix} \quad (4)$$

where each unitary matrix $X_j$ is of a size given by the number of atoms in slice j. The Hermitian matrix $F_{Full}$ in Equations (2) and (3), which has elements from the tight-binding model, is a block matrix of the form $$F_{Full} = \begin{pmatrix} A_1 & B_{1,2} & 0 \\ B_{1,2}^\dagger & A_2 & B_{2,3} \\ 0 & B_{2,3}^\dagger & A_3 \end{pmatrix} - E \begin{pmatrix} I_1 & 0 & 0 \\ 0 & I_2 & 0 \\ 0 & 0 & I_3 \end{pmatrix}. \quad (5)$$

Let $m_j$ be the number of atoms in slice j. Here for slice j the $m_j \times m_j$ Hermitian matrix $A_j$ has diagonal elements of the on-site energies ε for each of the $m_j$ atoms (every value of ε in a slice may be different) and off-diagonal elements of the intra-slice hopping parameters. The matrices $I_j$ are the $m_j \times m_j$ identity matrices. The matrices $B_{j,j+1}$ for hopping between atom pairs with one atom in slice j and one atom in slice j+1 are not necessarily square, having dimensions equal to the number of atoms in the two slices, namely are of size $m_j \times m_{j+1}$, and contain all the inter-slice hopping terms of the tight-binding model. In order to perform the mapping (see FIG. 1) onto a 1D chain of sites, the transformation matrix $X_1$ must satisfy $$X_1 \vec{w} = \begin{pmatrix} -\tilde{t}_w \\ \vec{0} \end{pmatrix} \quad (6)$$

where $\tilde{t}_w$ is the mapped hopping term between the mapped site for slice number one and the last site of the input lead. A similar equation must be satisfied in the connection of the atoms in the last slice (slice l) to the first site of the output lead, $$X_l \vec{u} = \begin{pmatrix} -\tilde{t}_u \\ \vec{0} \end{pmatrix}. \quad (7)$$

For each slice j the mapping equations for the intra-slice matrices must satisfy $$X_j A_j X_j^\dagger = \begin{pmatrix} \tilde{\epsilon}_j & \vec{0}^\dagger \\ \vec{0} & \tilde{A}_j \end{pmatrix} \quad (8)$$

where $\tilde{\epsilon}j$ is the on-site energy of the 'mapped atom' the entire slice j maps onto and the mapped terms in the $(m_j-1) \times (m_j-1)$ square matrix $\tilde{A}_j$ will not be important to calculate the transmission. The inter-slice equations must satisfy the set of mapping equations $$X_j B_{j,j+1} X_{j+1}^\dagger = \begin{pmatrix} -\tilde{t}_{j,j+1} & \vec{0}^\dagger \\ \vec{0} & \tilde{B}_{j,j+1} \end{pmatrix} \quad (9)$$

where $\tilde{t}_{j,j+1}$ is the 'mapped hopping' term between the mapped sites j and j+1 and the mapped terms in the $(m_j-1) \times (m_{j+1}-1)$ matrix $\tilde{B}_{j,j+1}$ will not be important to calculate the transmission. The essential simplification is that if transformation matrices $X_j$ can be found to satisfy the set of mapping Equations (6) through (9), then the original system is mapped onto a 1D system with the same electrical transmission $T(E)$. In other words, the mapped matrices $\tilde{A}_j$ and $\tilde{B}_{j,j+1}$ are disconnected from the leads in the 'mapped device', and hence do not contribute to the transmission probability of the electrons. The description presented here, and the mapping Equations (6) through (9), are not the most general mapping equations. They are given here to be representative of such simple mapping equations. All quantum dragon materials and devices are encompassed by the invention, not just those that may be found using these simplest of transformation matrices.

Calculating How to Connect Two Leads to Devise a Quantum Dragon: Tuning

The next step to perform calculations to find a quantum dragon is to perform a tuning of the parameters in the original device. The tuning is illustrated in the transformation from the 'mapped device' in the middle of FIG. 1 to the 'mapped and tuned device' on the bottom of FIG. 1. The mapped on-site energy $\tilde{\epsilon}_j$ for each 'mapped atom' is a function of all the on-site energies and intra-slice hopping parameters. Therefore adjusting any of these parameters in the original, physical device changes the value of $\tilde{\epsilon}_j$. The tuning is done to set $\tilde{\varepsilon}_j=0$ (remember the zero of energy was taken to be the on-site energy of the lead atoms). Similarly the tuning is done to give every 'mapped hopping parameter' $\tilde{t}_{j,j+1}=1$ (remember the unit of energy has been set so the magnitude of the hopping from one lead atom to the next is equal to one). Tuning provides a set of constraints on the tight-binding parameters of the physical device or material, thereby correlating the random values of the original tight-binding random parameters, which is called correlated randomness.

Quantum Dragon Devices with Axial Symmetry

Figure 2:
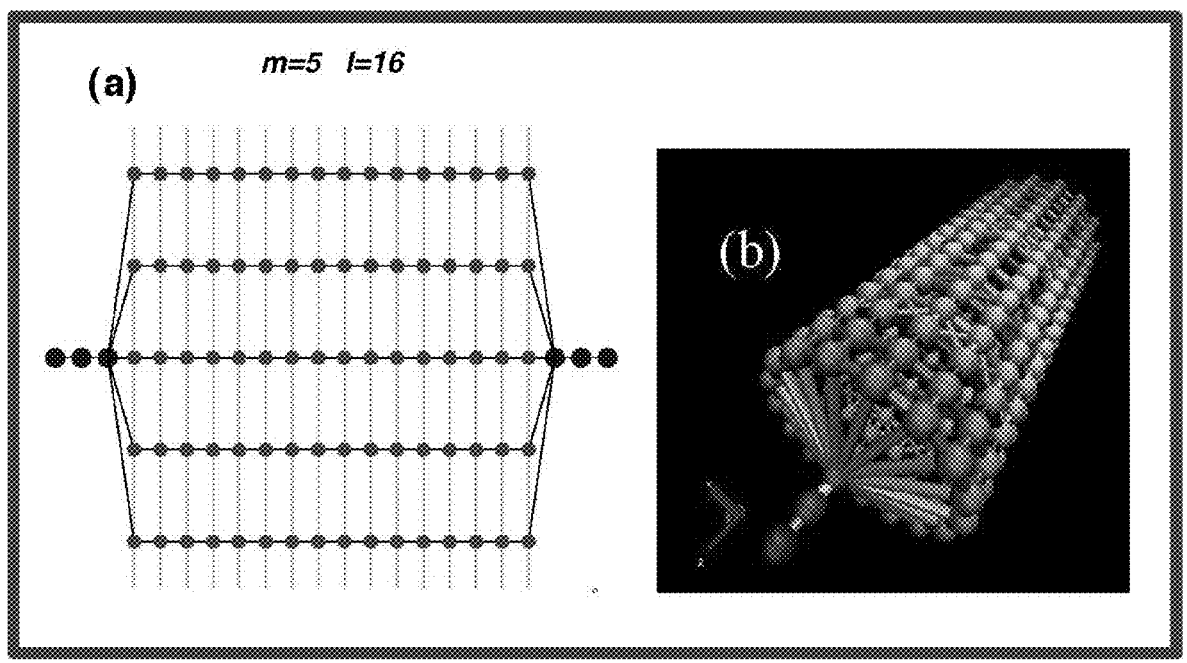
FIG. 2 depicts an illustration of two quantum dragons composed of tubes from a rectangular lattice.

The set of mapping equations, Equations (6) through (9), was first put forward by the inventor and provides many solutions to the mapping equations to give quantum dragons that have axial symmetry. Axial symmetry occurs when the device is rotated by some specific angle about the axis going through the leads, and the device is the same; in other words, the device is invariant to these rotations. A device with axial symmetry can also be viewed as a tube. FIG. 2 shows quantum dragons for tubes made by joining the edges of a rectangular lattice. Both the regular rectangular lattice nanotube in FIG. 2(*a*) and the rectangular lattice nanotube with correlated disorder in FIG. 2(*b*) are quantum dragons after proper tuning, having total electron transmission for all energies. To explicitly give the correlation in the mapping and tuning procedure, for a rectangular nanotube with m identical atoms in every slice one must correlate the disorder such that the mapping for every slice j in Equation (8), for m odd, has $$\tilde{\varepsilon}_j = \varepsilon_j - 2\sum_{k=1}^{\frac{m-1}{2}} t_k^{(j)} = 0 \quad (10)$$

with $\varepsilon_j$ the on-site energy of the atoms in slice j and the intra-slice hopping parameters $t_k^{(j)}$ for slice j connects every atom to the two other atoms that are k units apart on the circle (for example k=1 connects each atom to its two nearest-neighbor atoms in the slice). The mapping gives the mapped on-site energy to be $\tilde{\varepsilon}_j$, and the tuning (correlating the random variables $\varepsilon_j$ and $t_k^{(j)}$ is to ensure $\tilde{\varepsilon}_j=0$, because we have chosen our zero of energy to be the on-site energy of atoms in the semi-infinite leads. Related equations correlate the inter-slice hopping parameters in Equation (9) between every slice j and j+1, as well as the connections to the input and output leads in Equations (6) and (7), respectively.

Quantum Dragon Devices—Zigzag Nanotubes

Any quantum dragon nanotube with axial symmetry (see FIG. 3) is embodied by the present invention, unless it was previously known and described to be a device with ballistic electron propagation. For example, single walled carbon nanotubes in the armchair arrangement were previously known and described as ballistic [Hamada 1992], and measured to have conductance equal to integer multiples of $G_0$ [Frank 1998, Kong 2001], so that devices fashioned in whole or in part from armchair carbon nanotubes with minimal disorder are existing technologies. The inventor has shown that if armchair carbon nanotubes are connected to leads with a ratio of 1:2 in hopping strengths, then they no longer have T(E)=1. Zigzag carbon nanotubes (see FIG. 4) are predicted to be semiconducting for almost all values of the number of atoms m in each slice. However, the inventor has provided that when connected to leads with a 1:2 hopping strength ratio, as in FIG. 4, a zigzag single-walled carbon nanotube is a quantum dragon since it has T(E)=1.

FIG. 2 shows a quantum dragon device made from a tube with an underlying rectangular lattice. Part (a) shows three atoms in each lead, for a nanodevice made from a rectangular lattice, here unrolled for better visualization. The rectangular lattice has m=5 atoms in each slice and l=16 slices. The rectangular lattice in (a) has no disorder. A similar nanotube based on a rectangular lattice with m=17 atoms in each slice and l=16 slices is shown in (b). The nanotube in (b) has axial symmetry (all atoms in any given slice are identical), but has disorder from one slice to another, both within a slice and from one slice to an adjacent slice. A proper tuning of the parameters in both (a) and (b) gives total transmission, namely a quantum dragon. Without the tuning, the electrical conductance G would be very small for both of these nanotubes.

Figure 3:
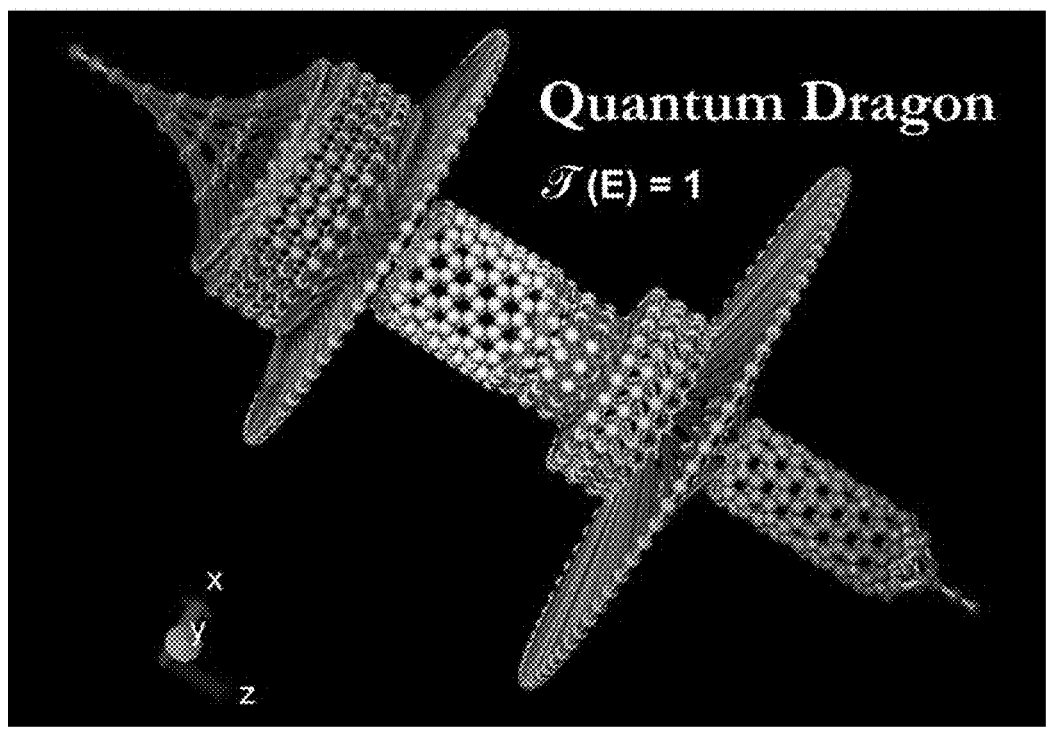
FIG. 3 depicts an example of a complicated, strongly disordered quantum dragon nanodevice with axial symmetry.

FIG. 3 shows an example of a complicated, strongly disordered quantum dragon device or nanodevice with axial symmetry. This sketch shows that joining different segments (here nine different types of lattices rolled into tubes) that are quantum dragons can yield a complicated larger quantum dragon. The electron flow is along the z-axis, with only three atoms of each of the semi-infinite leads shown.

Figure 4:
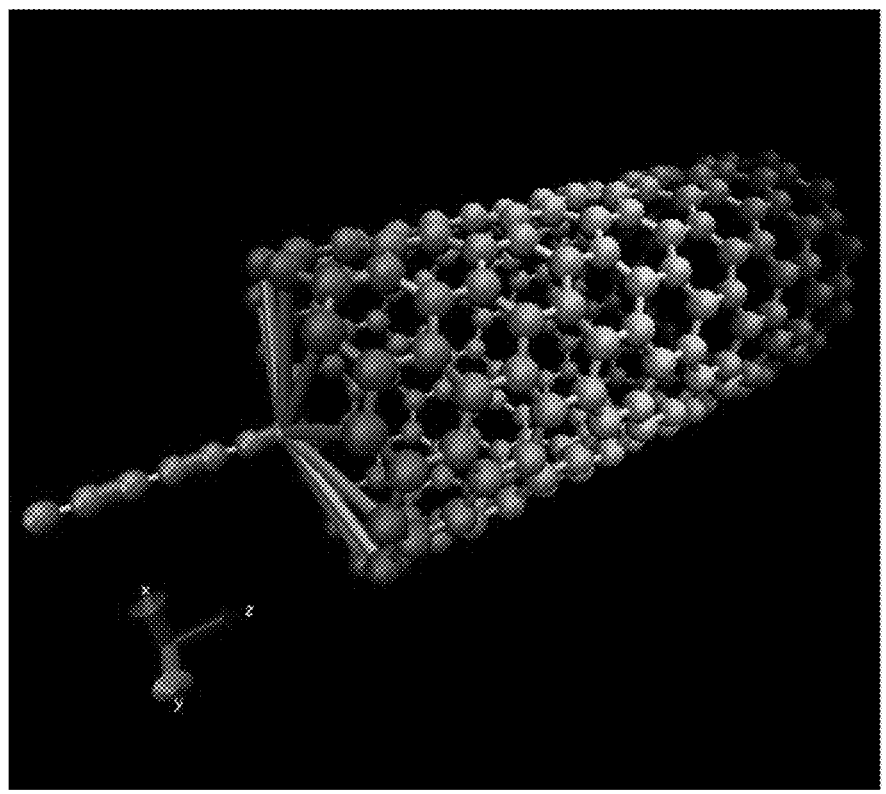
FIG. 4 depicts a zigzag single-walled carbon nanotube, showing the leads with a 1:2 ratio that enables the nanotube to be a quantum dragon with full electron transmission.

FIG. 4 shows a zigzag single-walled carbon nanotube. Zigzag carbon nanotubes were once thought to be insulating, since experimentally they have a very small electrical conductance G. However, the inventor has shown that if they are connected to leads with a 1:2 [yellow:magenta] ratio of hopping parameters, as shown in the Figure, they are quantum dragons and hence in a four-probe measurement will have G=∞. The electron transport is along the z-axis, and only seven atoms [green] of the incoming semi-infinite lead 400 are shown. The nanotube has l=20 slices and every slice has m=12 atoms.

Quantum Dragon Devices Used as Ideal Wires

Due to the axial symmetry of the devices, both semi-infinite leads must be connected along the axis of the cylinder (see FIGS. 2, 3, and 4). Because of the mapping in Equations (6) through (9), these axially symmetric nanodevices make ideal wires (whether they are regular or have correlated disorder). After the mapping, each slice j has a mapped on-site energy $\tilde{\varepsilon}_j$ and a mapped slice-to-slice hopping $\tilde{t}_{j,j+1}$. The nanomaterial with axial symmetry could be connected directly to the macroscopic objects that provide the source and sink of the electrons. If all slices were set to have $\tilde{\varepsilon}_j=0$ and $\tilde{t}_{j,j+1}=1$, the nanomaterial would be an ideal lead. In other words, it would be an ideal wire to connect any quantum device to a large or macroscopic electron sink and source. Alternatively, one could utilize a zigzag single-walled carbon nanotube to be idealized leads that have a mapped value $\tilde{\varepsilon}_j=0$ as well as $\tilde{t}_{j,j+1}=1$ for odd j (thereby setting our unit of energy) and $\tilde{t}_{j,j+1}=2$ for even j; making it an ideal wire with a ratio of hopping parameters 1:2 (as the leads in FIG. 4 show). The claimed wires are not required to have any regularity, as do the armchair and zigzag carbon nanotubes. The claimed wires require only that the mapped on-site and mapped hopping parameters have a particular ratio. For example, an ideal wire could be constructed with all $\tilde{t}_{j,j+1}=1$ while the ratio of mapped on-site energies were 0:15:8:3:1 for the number of the lead sites modulo five, consequently the ratio repeats every five atoms along the lead. Any desired ratio of mapped on-site energies and/or of mapped hopping parameters are permitted, and every such ratio makes a particular ideal wire to act as a lead to connect a large or macroscopic source and sink to another nanomaterial. If the other nanomaterial has the same ratios for the mapped on-site energies and mapped hopping parameters as do the wires that form the leads, the entire nanodevice of nanomaterial plus the semi-infinite leads will have $T(E)=1$ and hence be a quantum dragon nanodevice. Therefore, these ideal wires, comprised of any slice-to-slice ratio of the mapped on-site energies and/or of the mapped hopping parameters, are encompassed by the present invention. Although nanosystems with axial symmetry is described herein, as shown below the axial symmetry property is not required to make ideal wires. Ideal wires may connect a nanomaterial to large or macroscopic objects, or may connect one nanomaterial to another nanomaterial. A given nanomaterial may be connected by any number of the ideal wires of the invention.

Quantum Dragon Devices Comprised of Joining Crystals

A tube can be considered to be a 2D crystal, only rolled up into a 3D tube (see FIG. 2). It is possible to have many types of tubes be quantum dragons. It is also possible to join together such tubes wherein each is a quantum dragon which thereby forms a quantum dragon made from the joined tubes. One embodiment is illustrated in FIG. 3. The tubes in FIG. 3 are rectangular nanotubes, single-walled armchair nanotubes, single-walled zigzag nanotubes, and tubes composed of Bethe lattices. FIG. 3 has nine different tubes joined together, but this number is arbitrary. This joining of two or more quantum dragon tubes can be generalized to joining two or more crystals together, as shown below. All composite quantum dragon nanodevices are encompassed by the invention. Composite quantum dragon nanodevices may consist of two or more joined tubes, one or more tubes joined to one or more crystals, or two or more non-identical crystals joined together. As detailed below, composite quantum dragon devices may also be composed by joining any combination of quantum dragon tubes, quantum dragon crystals, or quantum dragon amorphous slices.

Quantum Dragon Devices without Axial Symmetry

The inventor coined the term quantum dragons and gave solutions to the mapping in Equations (6) through (9) for cases of axially-symmetric nanomaterials and nanodevices. The invention discloses that other solutions to the mapping Equations (6) through (9) can be found. The present invention encompasses all quantum dragon nanomaterials and nanodevices, namely any such material or device that when connected to appropriate long leads has $T(E)=1$. These devices may be semi-regular, may be strongly disordered, or may even appear to be very tatty, or frayed, devices. Quantum dragon nanodevices and nanomaterials are claimed whether or not they follow from the simplest mapping equations described by Equations (6) through (9); the important aspect is that they exhibit the property of total electron transmission for all energies, namely $T(E)=1$. Furthermore, the quantum dragon devices claimed can have normal operating cycles wherein only a portion of the operation cycle has the $T(E)=1$ property. For example, in FETs it is desirable during the normal operation of the device to go from an applied electric field, wherein the device has $T(E)=1$, to an applied electric field wherein the device has a very small electron transmission. Furthermore, all devices wherein the transmission $T(E)$ is greater than or equal to about 0.85 are encompassed by the invention, as are nearly quantum dragon devices wherein the transmission $T(E)$ is greater than or equal to about 0.50, since they thus operate near the region of parameter space such that materials in that region are quantum dragon materials.

Quantum Dragon Prescription 1—Manipulating Lead Attachment Bond Strength

Figure 5:
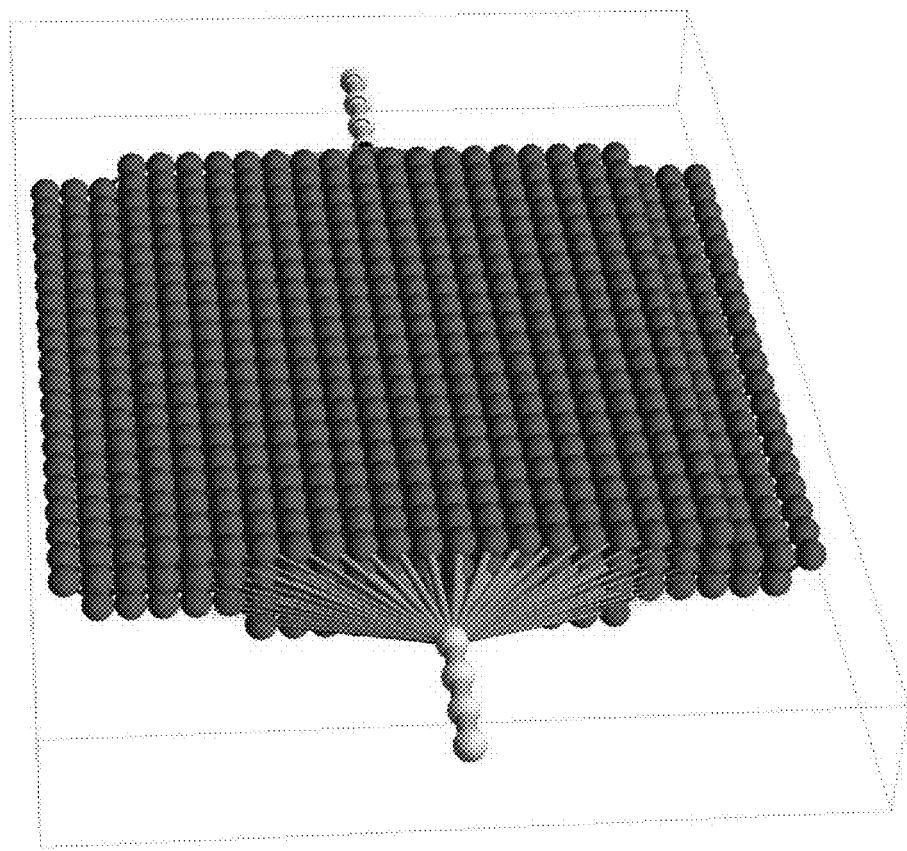
FIG. 5 depicts a quantum dragon of the present invention from an SC lattice, with an arbitrary cross-section.
Figure 6:
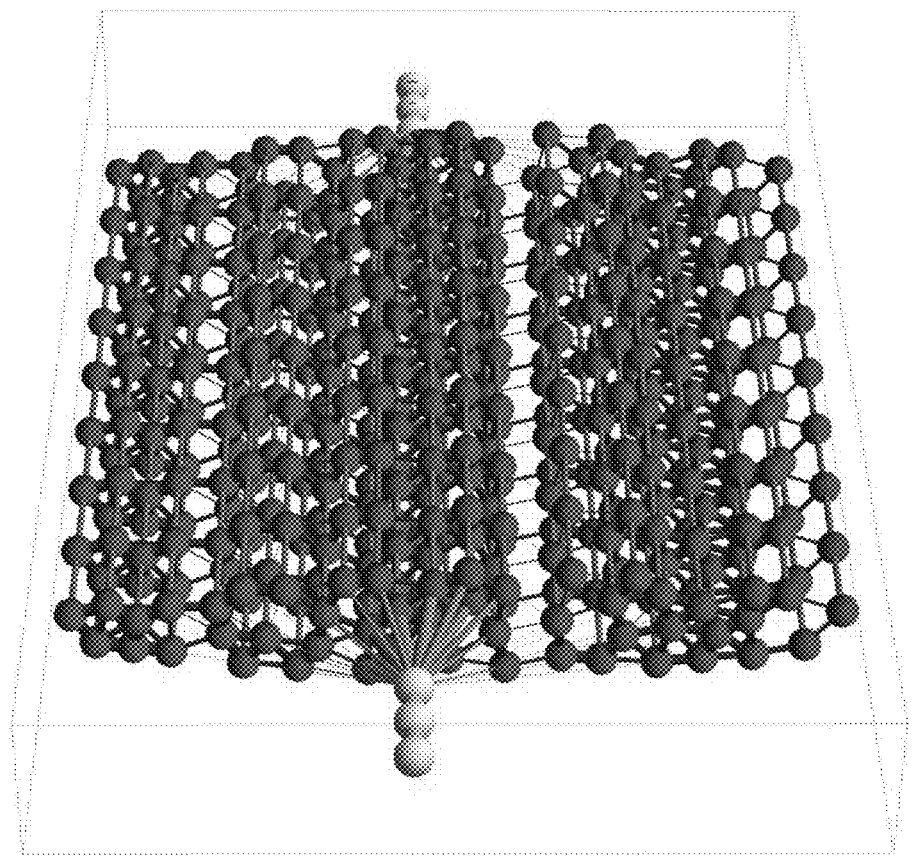
FIG. 6 depicts a quantum dragon of the present invention with strong disorder in every slice, but identical slices.

Once the material to connect to leads is created, one embodiment of a method of optimizing electron transmission is manipulating the lead position in relation to the position of the atoms in the first and last slice. Prescription 1 is illustrated in FIGS. 5 and 6. Every slice is identical and has m atoms. In this prescription, the simplest slice-to-slice interactions, namely $B_{j,j+1}=-I_m$, is used. In other words, the inter-slice hopping only was between nearest neighbors, and all had hopping strength unity. In FIG. 5, an arbitrary cross section of a simple cubic (SC) lattice (with nearest and next-nearest neighbor hopping within each slice) makes up the nanomaterial, and the nanodevice is constructed with long (idealized to be semi-infinite) leads connected to the front and back planes of the nanomaterial. This quantum dragon may be constructed of polonium, which is the only element that has a simple cubic arrangement at standard temperature and pressure. Other materials may also be used by constructing a simple cubic SC lattice with a more complex unit cell, said unit cells being stacked in the simple cubic arrangement.

FIG. 5 shows a quantum dragon without axial symmetry. This is composed of a simple cubic (SC) lattice with a general cross-section, here with each of the l=20 slices identical and made up of m=76 atoms. Only four atoms [white] in each semi-infinite lead are shown. By connecting the leads as shown [green cylinders] through known electrical connection processes, the device is a quantum dragon using prescription number 1.

To satisfy Equations (6) and (7), the leads must be attached in one particular fashion (for zero magnetic field), as obtained using the Perron-Frobenious theorem for non-positive matrices (after an appropriate shift of the intra-slice matrix diagonal elements). For the SC lattice of FIG. 5, every slice has 3 tight-binding parameters, the on-site energy and the nearest and the next-nearest neighbor hopping strengths. The three parameters within every slice in FIG. 5 must be adjusted to satisfy an equation similar to Equation (10). Once this tuning is performed, there is a correlation of the tight-binding parameters within a slice. Similarly tuning is performed between the leads and the first and last slice, and the device in FIG. 5 becomes a quantum dragon, since $T(E)=1$. Tuning is accomplished by determining how to connect the lead(s) to the device to keep or retain the $T(E)=1$ property. However, a practitioner only has to approximately connect close to the optimal tuned arrangement, and still the transmission $T(E)$ can be large, as in about 50%. FIG. 6 uses the same prescription one, but now every atom within the slice is randomly placed within a generalize ellipse. Therefore the slices are amorphous, as the atomic positions are random (except atoms must be at least a certain distance apart). Then all atoms in a slice (up to a certain cutoff distance) are taken to have hopping parameters inversely proportional to the distance (denoted by the radii of the [blue] cylinders within a slice). In general, if every slice has m atoms, the number of parameters in prescription number 1 is $(m^2+5m+1)/2$, while only $2m+1$ tight-binding parameters were tuned to obtain a quantum dragon nanodevice.

The number of tuned parameters were m for each of the two leads, and one for tuning an intra-slice parameter. The atoms in every slice may also be different and the tuning to find a quantum dragon still can be accomplished, for example as sketched in FIG. 7 for two different types of atoms and SC lattices with moderate (inner atoms [blue]) or strong (outer atoms [yellow]) disorder from an ideal SC lattice. The take-home message in prescription 1 is that, as long as every slice is identical and $B_{j,j+1}=-I_m$, there is a way to tune at least one of the parameters and to attach the leads so that $T(E)=1$ and therefore one has a quantum dragon nanodevice. The quantum dragon devices exist on a 2m+1 dimensional 'surface' within the 'volume' of the total $(m^2+5m+1)/2$ dimensional parameter space.

FIG. 6 shows a quantum dragon wherein every slice is the same, but all m=50 atoms within a slice are completely disordered (no crystal structure within a slice). Only three atoms [white] in each semi-infinite lead are shown. The method to connect the leads [orange cylinders] to such a device in order to make it into a quantum dragon device uses prescription number 1.

Figure 7:
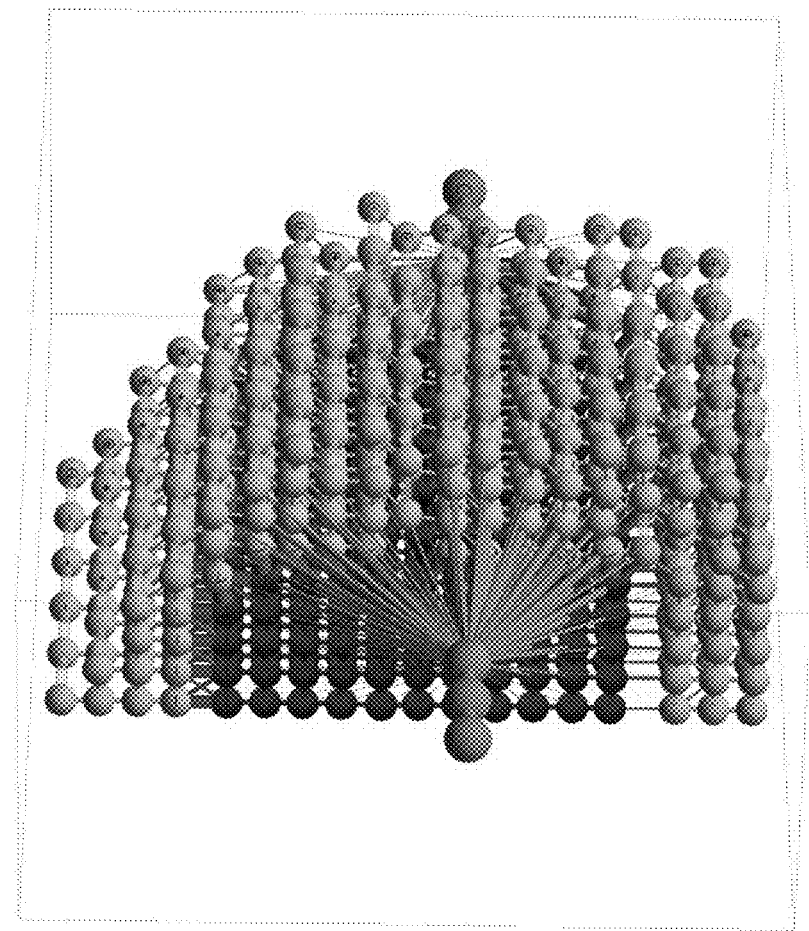
FIG. 7 depicts a quantum dragon of the invention composed of two different types of atoms in every slice [yellow and blue], both in disordered SC lattices.

FIG. 7 is a sketch and illustration of a quantum dragon nanodevice composed of two different types of atoms in every slice [yellow and blue], both arranged in disordered SC lattices. The device is tuned to be a quantum dragon, and the connections to the semi-infinite leads [orange spheres, here only three spheres shown] use prescription number 1 and are shown as [orange] cylinders, with the radii of the cylinder proportional to the hopping term in $\vec{w}$.

Quantum Dragon Prescription 2—Applying Electric and/or Magnetic Fields

Figure 8:
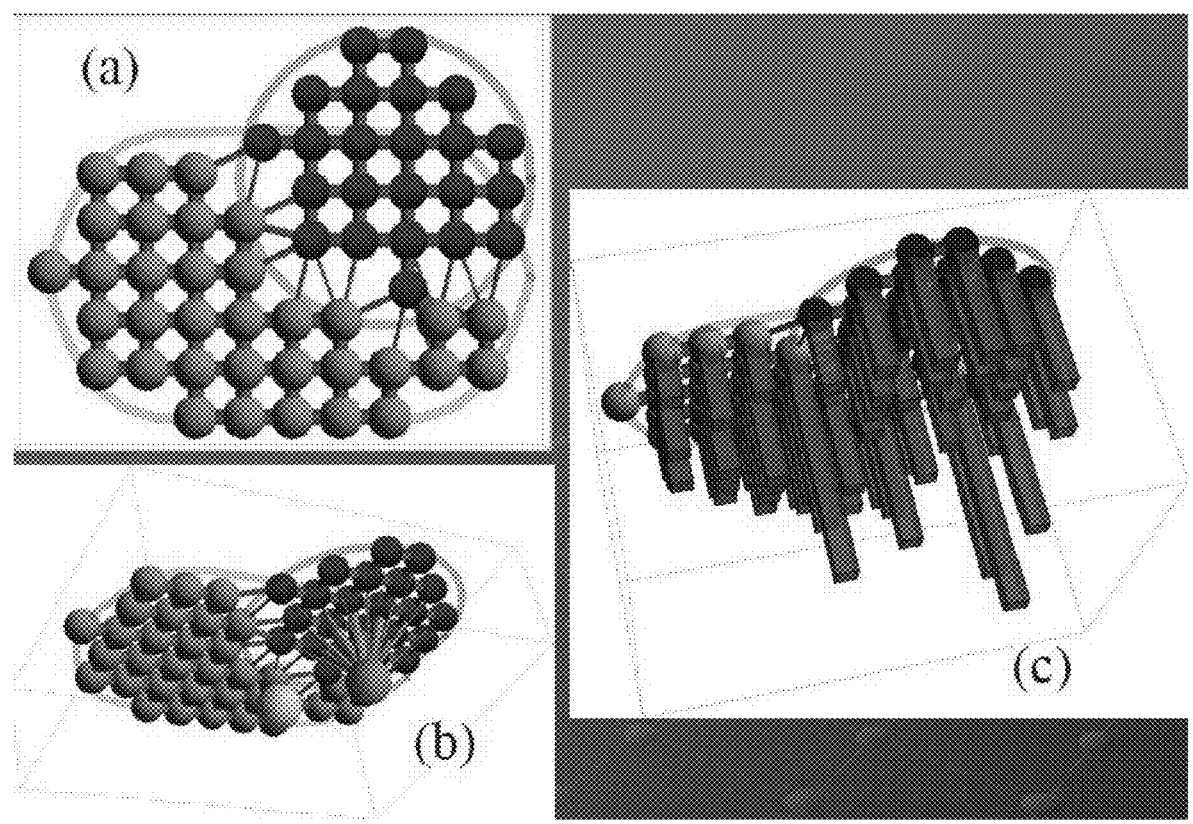
FIG. 8 depicts an illustration of prescription number 2 to create a quantum dragon device or nanodevice of the present invention.

Electron transmission of a quantum dragon may also be optimized by applying an electric and/or magnetic field to the device. Prescription 2 provides an alternative way to create quantum dragon devices. The on-site energies come from two contributions: one is from the Schrödinger equation discretization, while the other is the electrical potential $U_k$ at the atom labeled by k. In theory, every electrical potential $U_k$ can be adjusted by applying the appropriate external electric field to the nanodevice (the electric field is applied only in directions within a slice, without a component along the direction of the electron flow). Without an applied field, all $U_k=0$ and prescription number 1 shows that there is a way to attach the leads to give a quantum dragon. However, suppose the leads were attached in some other fashion and the ratios of the hopping parameters which are elements of the vectors $\vec{w}$ in Equation (6) and $\vec{u}$ in Equation (7) are fixed (but their overall strengths can be adjusted). Then prescription 2, as sketched in FIG. 8, shows there is a way of applying an external electric field in order to satisfy the mapping equations in Equations (6) through (9) to make the nanodevice with this initially miss-aligned lead into a quantum dragon nanodevice. Remember the relationship between the electric potential and the electric field is $\vec{E}(x,y)=-\nabla U(x,y)$, where the electron flow is along the z direction and the slices are in the x,y plane. The value $U_k$ is the value of $U(x,y)$ at the x,y position of atom k. In other words, in prescription number 2 the leads may be placed anywhere, and it is possible to apply an external electric potential so that the nanodevice has $T(E)=1$ and hence is a quantum dragon nanodevice. The analysis here involves zero magnetic field, but a similar analysis is possible when there is a magnetic field. Quantum dragon devices enabled by applied electric fields, such as FETs, and devices enabled by magnetic fields, such as the spin-polarized injectors described below, are therefore encompassed by the present invention.

FIG. 8 illustrates the method to obtain a quantum dragon via prescription number 2. Two types of atoms [blue and green] are shown in (a), each on a part of an SC lattice that fits within the [light blue and light green] generalized ellipses. The intra-slice hopping parameters are [orange or red] cylinders, with the radii proportional to the hopping strength. There are m=57 atoms in every slice. From prescription number 1, a quantum dragon can be obtained by connecting via known electrical connection processes the leads centered at the location of the [yellow] sphere without cylinders attached placed above the first slice, as shown in (b). Assume, however, that the lead is actually attached at a different location as seen by the other [orange] sphere placed above the slice, and furthermore that the ratios of the interactions of this lead atom and the atoms in the first slice are fixed arbitrarily (the attached [orange] cylinders). Then there is a method to apply an electrical potential for each atom, the value given by the height of the [red] pillars in (c), to make the device or nanodevice into a quantum dragon. The Figure only shows one slice, but the prescription works for devices composed of many slices.

Quantum Dragon Prescription 3—Slices May be Different

Figure 9:
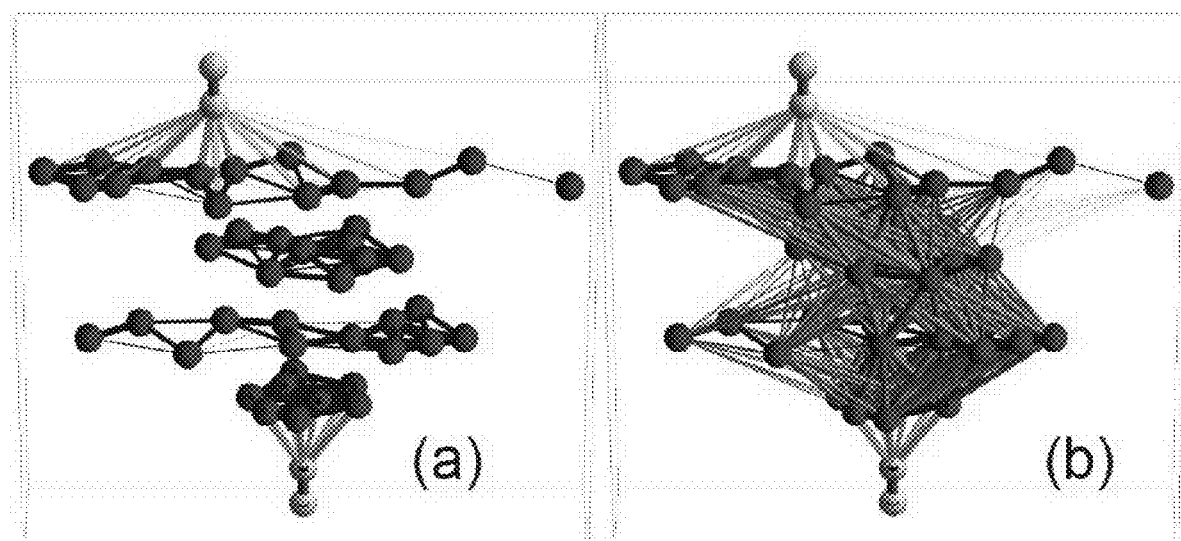
FIG. 9 depicts an illustration of prescription number 3 to create a quantum dragon device or nanodevice of the present invention, even for very strong scattering.

Quantum dragon electron transmission may be achieved when the slices making up the device are different shapes and have different numbers of atoms. Prescription 3 tunes the inter-slice interactions in the matrix $B_{j,j+1}$ in a general way and allows every slice to be different. This prescription is illustrated in FIG. 9. Here all electric potentials $U_k=0$, and there is no magnetic field. The number of atoms in every slice may be different, and the intra-slice hopping terms between the atoms can be arbitrary. There are ways to connect one layer to the next in order to satisfy the mapping of Equations (6) through (9) to give quantum dragon nanodevices, namely to have $T(E)=1$. One such connection or embodiment is shown if FIG. 9, but not all cases or embodiments encompassed by the invention look so complicated. It is important to realize that extremely strong disorder can be present for a large number of slices I, and for such strong disorder the band-structure picture of electron conductance is no longer valid. This is the reason that band-structure arguments have not been made or used herein, since band structure arguments are valid for crystalline devices or devices with weak disorder, but not for all types of quantum dragon devices.

FIG. 9 sketches and shows prescription number 3 to create a quantum dragon, shown here for very strong disorder. In (a), forty-four atoms [red spheres] are randomly placed in four planes within arbitrary generalized ellipses (not shown) in each slice, and the spheres within the same slice (in the same plane) are connected with hopping parameters of various strengths inversely proportional to their distance, but to some cutoff, shown as [blue] cylinders with radii proportional to the hopping strength. The lead atoms are shown as [white] spheres, here only two atoms in each semi-infinite lead is shown. The device has l=4 slices. In (a), only intra-slice hopping terms are depicted, illustrated by the [blue] cylinders. The method to connect the input and output leads is shown as [white] cylinders in (a) to satisfy the mapping of Equations (6) and (7). To satisfy the mapping of Equations (8) and (9), there are (usually many) methods of connecting the atoms in adjoining slices, here for example with a complicated connection pattern given by the [orange] cylinders between the l=4 slices.

Quantum Dragon Prescription 4—Make Allowed Proper Operations

Quantum dragon electron transmission may be achieved by making proper operations of the underlying graphs and/or the Hamiltonian associated with the nanodevice. The graph has the atomic location as the vertices, and the interactions between the neighboring atoms are the bonds. The Hamiltonian (tight-binding model or Hückel model) has an onsite energy for each atom and an electron hopping term between neighboring atoms. The proper operations are done in such a way that the device remains a quantum dragon, namely continues to have T(E)=1. The disclosure of this prescription is based on a paper by the inventor [Novotny 2020]. The proper operations that enable a quantum dragon nanodevice can include:

Printing
  Changing simultaneously either locally or globally within a slice the values of the on site energies and the associated hopping terms;
Cutting or unzipping
  Removing a bond in the graph, namely cutting the bond, while simultaneously changing the on site energies associated with the cut bond;
Sewing or zipping or stitching
  Adding a bond between to select atoms, while simultaneously changing the on site energies associated with the added bond;
Twisting
  Any portion of the graph along the direction of electron flow may be detached, twisted, and then reattached to a part of the graph, including adding a phase (multiplying by $e^{-i\varphi}$ for some angle $\varphi$) to the bonds associated with the twist;
Braiding
  Portions of the graph along the direction of electron flow may be detached, braided by orienting them differently in 3D, and then reattached to a portion of the graph;
Moving some bonds
  Done while simultaneously changing the on site energies associated with the moved bond;
Combinations of the above proper operations.

All of these proper operations keep the device as a quantum dragon. Performing operations similar to these but which are not done properly, for example by not changing the Hamiltonian parameters while changing the graph, will lead to strong electron scattering that causes the transmission to become very small (such as less than 1%).

Quantum Dragon Prescriptions—Combinations of Prescriptions

The present invention encompasses the general methodology to obtain or devise quantum dragon nanomaterials and nanodevices (nano to micro), not only the four prescriptions or embodiments detailed herein. For example, it is possible to combine the four prescriptions, doing or accomplishing some of each, in order to satisfy the mapping of Equations (6) through (9) and hence obtain a device with T(E)=1. All quantum dragon devices enabled by utilizing the four prescriptions above, for example, and related embodiments of these prescriptions that can be practiced by practitioners of the arts based on the disclosure of the present invention, and any combinations of these prescriptions, are likewise encompassed by the invention.

Practical Embodiments of Quantum Dragon FETs

One of many embodiments of a quantum dragon material device is a field effect transistor (FET). The prescriptions herein illustrate methods a quantum dragon FET can be devised. Assume the 'on' state of the device has a large electric current flowing through the device and the 'off' state has a negligible electric current flow. If the FET is a two-lead device with a single open channel and with an applied voltage V, then the large current may be one where approximately $I=G_0 V$, while the small current would be at most about 25% of the large current. An electric field $\vec{E}_x$ can be applied perpendicular to the direction of the electron flow. For one value of applied electric field $\vec{E}_x$ assume the leads are attached so the device is a quantum dragon, hence because T(E)=1 there will be a large current flowing through the device (the 'on' state of the FET). The leads are assumed to be fixed, and hence do not change during the operation cycle of the FET. However, the value of the applied electric field $\vec{E}_x$ can be changed but then the mapping equations no longer hold. Nevertheless, in principle the transmission can be numerically calculated using the inverse of the full matrix, as shown in Equation (2). Changing the value of the applied electric field $\vec{E}_x$ changes the function TE) and hence the voltage across the device changes by Equation (1), and the current through the device decreases from its value at the quantum dragon value of the electric field. If the current becomes small enough, then the FET is said to be in the 'off' state. Alternatively, a small electric current could be the 'on' state and a large electric current the 'off' state.

Figure 10:
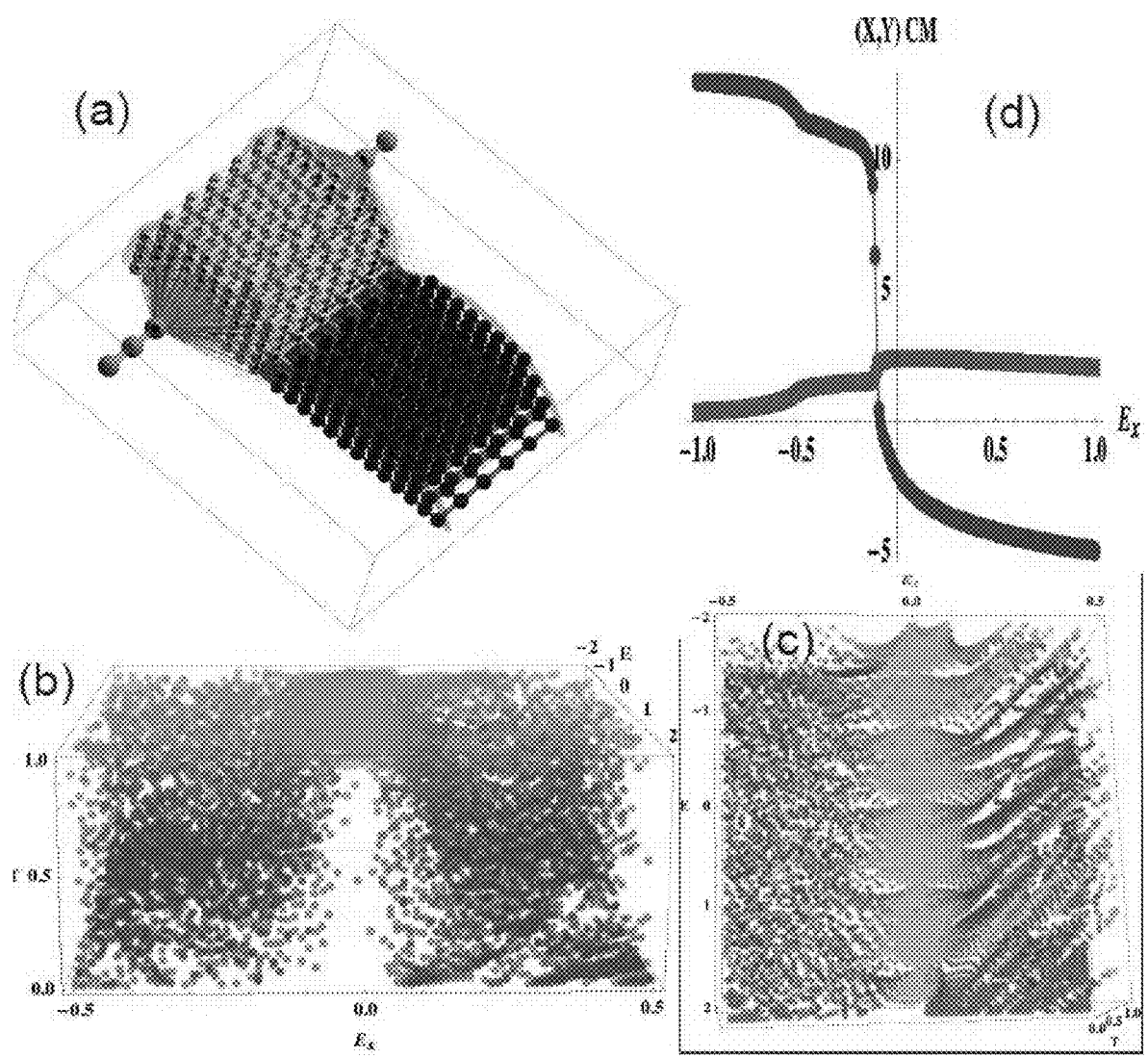
FIG. 10 depicts an illustration of an efficient quantum dragon FET of the invention, based on an SC lattice, with a particular shape.
Figure 11:
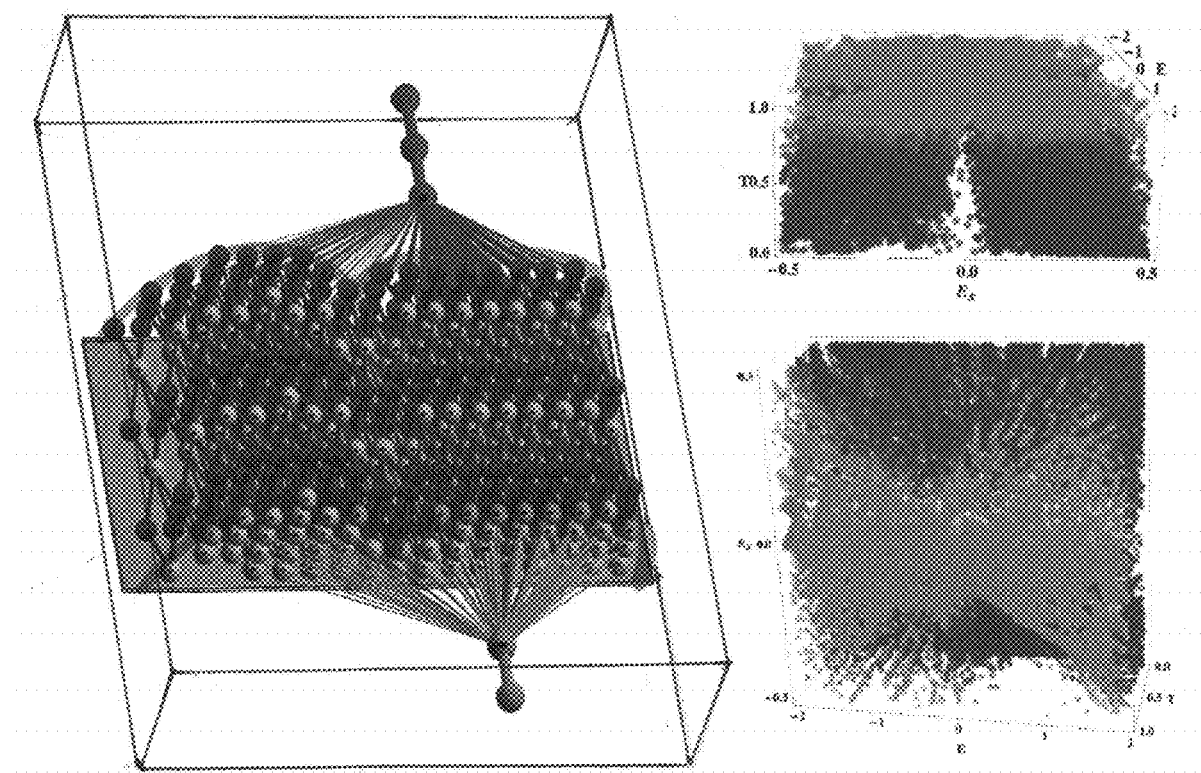
FIG. 11 depicts an illustration of an efficient quantum dragon FET of the invention, based on a BCC lattice, with a particular shape.

Any change of the applied electric field changes the current, but for an efficient FET a very small change (quantified below) in the applied electric field causes a large change (quantified below) in the current flow. Importantly, different shapes of quantum dragon devices and materials allow efficient FETs. One embodiment is illustrated in FIG. 10, here using an eye-glasses shape of an SC crystal. An indication of how efficient the switch from 'on' to 'off' or vice-versa is can be obtained for each applied field $\vec{E}_x$ calculating the center-of-mass (CM) position required for the leads to make the device a quantum dragon device using prescription number 1. The CM for the x-axis is represented by the formula $$x_{CM} = \frac{\sum_k w_k x_k}{\sum_{k'} w_{k'}} \quad (11)$$

where the sums are over all m atoms in the first slice, $x_k$ is the x-coordinate of the $k^{th}$ atom of the slice, and $w_k$ is the $k^{th}$ element of the vector that is necessary to connect the lead atom to the device in order to obtain a quantum dragon by prescription number 1. The same analysis applies for $y_{CM}$. If either $x_{CM}$ or $y_{CM}$ changes rapidly (changes by more than 0.1 nanometers) for a small change of the applied field $\vec{E}_x$, the FET will be efficient. A small change in electric field is best quantified by ensuring that the difference in the electric potential between the nuclei of any two atoms within a slice changes by less than one nano-volt. In FIG. 11, this large change in $x_{CM}$ due to a small change in $\vec{E}_x$ is accomplished by having a shape so that the required lead connection for a quantum dragon nanodevice changes from nearly centered in one of the 'eyeglass lenses', as shown in FIG. 11(a), to one nearly centered in the other 'eyeglass lens'.

FIG. 10 sketches and shows a quantum dragon FET, here made from a particular shape of an SC lattice. The shape is an inverted eye-glasses shape, with two nearly disconnected parts of the crystal [one with yellow atoms and one with blue atoms]. The current flow is along the z-direction, the direction of the attached leads 1000, here with three [green] atoms shown for each semi-infinite lead. A uniform electric field $\vec{E}_x$ is applied along the x-direction (the direction to traverse to get from one lens of the eyeglass shape to the other lens). When $\vec{E}_x=0$, prescription number 1 can be used to attach the leads in the proper and optimum fashion to give or provide a quantum dragon, and T(E)=1. Figures (b) and (c) show the transmission T(E, $\vec{E}_x$) in two different views. [In the color coding, green is close to T=1 and red is very small transmission T]. The quantum dragon transmission T(E, 0) is evident in (b) and (c). Note the lead connection does not change as $\vec{E}_x$ changes, so the mapping does not work for a non-zero electric field. For any applied electric field, there is a position x,y, labeled as the 'center-of-mass CM' of the location where the lead must be attached using prescription number 1 to obtain a quantum dragon. The efficiency of the FET is best where during the normal operation cycle a small change (quantified herein) in the applied electric field $\vec{E}_x$ makes a large change (quantified herein) in the CM location, here evident near $\vec{E}_x \approx -0.15$.

FIG. 11 sketches and shows a quantum dragon FET, here made from a particular shape similar to that of FIG. 10, but with a BCC underlying lattice. The BCC crystal is here arranged so that there are no intra-slice interactions between atoms within any slice. Note the disorder included within each slice. The BCC lattice therefore has slices with an even-odd structure [yellow atoms or blue atoms]. Every odd-numbered slice [blue atoms] is identical and every even-numbered slice [yellow atoms] are identical, but the odd- and even-numbered slices are different. The input and output leads [green and magenta] must be connected to the two end slices differently since there are an even number of slices in the material or nanomaterial. Note that, in zero magnetic field, the device is a quantum dragon no matter whether the current flows in the +z or −z direction. The leads here are uniform and every atom in the lead has the same on-site energy and same hopping energy, even though the BCC crystal has an even-odd structure. The two different views show the transmission T(E, $\vec{E}_x$), and illustrate [same color scheme as FIG. 10] the quantum dragon T(E)=1 behavior at $\vec{E}_x=0$.

Crystalline Quantum Dragons Beyond SC

Many more elements and compounds have a BCC (body centered cubic), FCC (face centered cubic), 3D hexagonal lattice, diamond lattice structure, or other lattice structures (such as tetragonal) than have a SC crystal structure. In FIGS. 5, 7, 8, and 10 the SC lattice was used as an illustration because of ease of satisfying the mapping in Equations (6) through (9) and because of ease of visualizing the nanodevice or device. Any device based on any type of atomic arrangement, and any crystal shape or amorphous material, can in principle and application be connected to leads and/or have applied electric and/or magnetic fields so that it is or becomes a quantum dragon with T(E)=1. All such quantum dragon materials and devices are encompassed by the present invention. See for examples FIG. 6 (amorphous slices) and FIG. 9 (amorphous device) for disordered materials.

In many instances, the associated mapping equations become more complicated. For example, consider an FET made from a slightly disordered BCC crystal, shown in FIG. 11, with a 'eyeglass' shape similar to that of FIG. 10. In FIG. 11, all even-numbered slices are the same and all odd-numbered slices are the same, but even- and odd-numbered slices are different. Furthermore, the inter-slice hopping terms between even-to-odd and odd-to-even are mirror images of each other. Therefore, this even-odd structure must be reflected to generalize the mapping equations to find quantum dragon materials. This has been done successfully, as shown in FIG. 11, where T(E,0)=1 while values of the applied electric field other than $\vec{E}_x=0$ do not satisfy the generalized mapping equations. Thus a quantum dragon FET based on such a BCC crystal will behave similarly to one based on the SC crystal in FIG. 10. Efficient BCC FETs may be one of the most rapid forms of quantum dragons to commercialize. Materials that may be used to construct a BCC FET include, but are not limited to, lithium, sodium, potassium, iron, molybdenum, chromium, vanadium, niobium, barium, rubidium, europium, cesium, manganese, tungsten, and tantalum, or combinations thereof.

Quantum Dragons and Magnetic Fields

Quantum dragon devices and nanodevices also work in applied magnetic fields and lead to devices and nanodevices with novel applications. Assume the magnetic vector potential is $\vec{A}(\vec{r},t)$, then in the tight-binding model the replacement $$t_{j,k} \rightarrow t_{j,k} \exp\left(-\frac{i e}{\hbar} \int_{\vec{r}_j}^{\vec{r}_k} d\vec{r} \cdot \vec{A}(\vec{r},t)\right) \quad (12)$$

should be made, where the line integral is along the path from the position of atom j to the position of atom k. In the normal fashion the magnetic field is given by $\vec{B}(\vec{r},t)=\vec{\nabla}\times\vec{A}(\vec{r},t)$. The spin of the electron must be taken into account, so the Hamiltonian has an additional term of the form $$H_s = -\tfrac{1}{2} g^* \mu_B \vec{B}_{eff} \cdot \vec{\sigma} \quad (13)$$

where g* is the effective Landé factor for the electron, $\vec{\sigma}$ is the vector of Pauli spin matrices, $\mu_B$ is the Bohr magneton, and ne $\vec{B}_{eff}$ is due to a combination of the applied external magnetic field and an exchange field (such as in a ferromagnet or in a material with coupling between the spin of the electron and the orbital angular momentum of the electron). The operator that leads to the term in Equation (13) in the tight-binding Hamiltonian will have an additional on-site energy proportional to $\vec{B}_{eff} \cdot \vec{\sigma}$ evaluated at the lattice site. In the simplest case, this gives the Zeeman energy splitting, and hence in this simplest case a different on-site energy exists for the spin-up and the spin-down electrons. Any of the prescriptions described herein can be used to tune a nanodevice for such a spin-up current to be a quantum dragon nanodevice, with $T_\uparrow(E)=1$. However, once the tuning is performed, due to the difference caused by the magnetic field in the on-site energies for the spin up and spin down electrons, the spin down electrons will not see a quantum dragon nanodevice and the transmission $T_\downarrow(E)$ will be small.

Quantum Dragon Spin-Polarized Injectors

The description following Equation (13) enables a spin injector, which will enable spintronics [Zutic 2004] applications. The quantum of conductance can be written as $G_0=(1_\downarrow+1_\uparrow)e^2/h$, in other words the factor of two comes from the fact that an electron has two spin states. Therefore, the electrical conductance in a two-lead measurement of an ideal spin-polarized quantum dragon nanodevice will have an electrical conductance $G=G_0/2$ since only the spin-up electrons would have $T_\downarrow(E)=1$, or integer multiples of $G_0/2$. The shape of the device or nanodevice, as for example described above and depicted in FIGS. 10 and 11, is instrumental in enabling an efficient quantum dragon spin injector. The efficiency of a quantum dragon spin injector can be measured as the ratio of the difference in the electric current of spin up versus spin down electrons, divided by the total electric current. In other words, the polarization ratio $$P_{polarization}=(I_\downarrow-I_\uparrow)/(I_\downarrow-I_\uparrow)\times 100\% \quad (14)$$

gives a measure of the efficiency of a spin injector. An efficient spin-polarized injector is one wherein the absolute value of this ratio has $|P_{polarization}|\geq 1\%$. Worth noting is that ballistic transport devices do not have any scattering, hence no spin-dependent scattering, and therefore it would be unthinkable to have a 'ballistic spin injector'. However, quantum dragon devices have the same property $T(E)=1$ but can have strong scattering, including strong spin-dependent scattering, thereby enabling embodiments of quantum dragon spin injectors. The most efficient quantum dragon spin injectors will be ones where, as shown in FIG. 10, the location where the lead must be attached to have $T(E)=1$ in prescription number 1 is very different for the analysis of spin-up and the spin-down electrons. The shape of efficient quantum dragon spin injectors are important—in one embodiment, the shapes include two or more large cross-sections connected by a narrow or constricted section. These shapes may include, for example eyeglass, figure-eight, hourglass, or dumbbell shapes, as depicted in FIGS. 10 and 11.

Quantum Dragon Optoelectronic Devices

Optoelectronic embodiments of the invention enabled by quantum dragon devices are those that would detect electromagnetic radiation, whether in the frequency range of visible light or outside the visible spectrum. As detailed above, embodiments to detect electric and/or magnetic fields are also encompassed by the invention utilizing quantum dragon devices. Electromagnetic radiation, viewed as time-dependent electric and magnetic fields governed by Maxwell's equations, can hence be detected by quantum dragon devices of the present invention. Devices encompassed by these quantum dragon materials utilize light and/or electromagnetic radiation to either interrupt or begin electron transmission (on/off) through the device. These devices are optoelectronic quantum dragon devices.

Quantum Dragon Sensors and Electronic Nose

Figure 12:
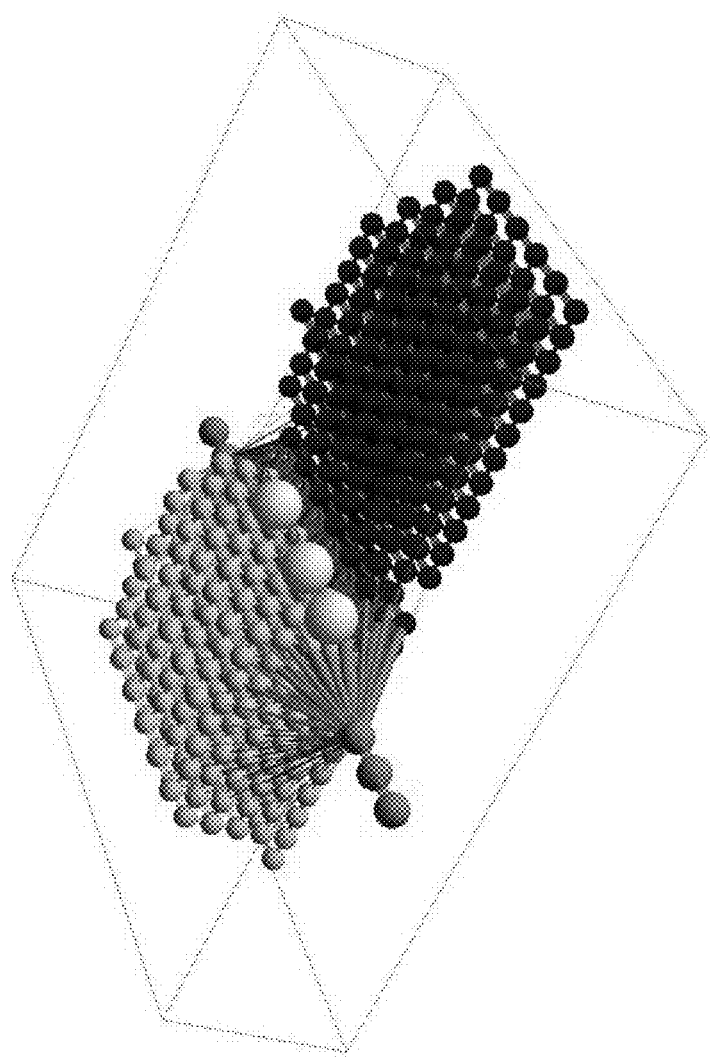
FIG. 12 depicts an illustration of a quantum dragon sensor device of the present invention.

Quantum dragon devices and nanodevices may be made into sensors for electric fields and/or magnetic fields as detailed above. Quantum dragon devices and nanodevices may also be made into sensors for atoms or ions or molecules that impinge upon or are adsorbed onto a quantum dragon device. The shape of the device or nanodevice is important in designing efficient sensors from quantum dragon devices. A sketch of one implementation or embodiment of a quantum dragon sensor is shown in FIG. 12. The ability to sense electric and/or magnetic fields has been detailed above and the importance of both the shape of the device and the location of the atoms in the device have been described. Efficient optoelectronic sensors for electromagnetic radiation are viewed as a combination of the measurement effects of time-varying electric and magnetic fields.

FIG. 12 sketches and shows a quantum dragon sensor device. The large [white] spheres denote atoms that may be near or chemisorbed or physisorbed onto the quantum dragon device. With the atoms present, the device is a quantum dragon with $T(E)=1$, but once the atoms are adsorbed the electron transmission and hence the electrical conductance can drop substantially, thereby making the device a sensor for detection of the [white] atoms (or ions or molecules). Shapes of the quantum dragon device can aid in sensing particular types of atoms or molecules. The shape here denotes an eyeglass shape [yellow and blue] based on an SC lattice. Three [green] atoms of each semi-infinite lead are shown, together with the lead-to-atoms-in-the-first-slice interactions required so that the lead attachment makes the device into a device with total electron transmission for a wide energy range, $T(E)=1$.

Quantum dragon devices and nanodevices may be configured to selectively sense small concentrations of specific molecules, atoms, and/or ions when they adsorb onto or are in the proximity of the device. An efficient sensor for particular atoms may have $T(E)=1$ when no atom is absorbed and a very small $T(E)$ when one or more atoms or molecules are absorbed (whether the atoms or molecules are chemisorbed or physisorbed). The main enabling methodology is that adsorbed atoms or molecules change the electrical conductance of the device. The device may have only a small conductance when no atom or molecule is absorbed, and be a quantum dragon and hence have infinite conductance in a four-terminal measurement when specific atoms or numbers of atoms are absorbed. Alternatively, with zero absorption the device could have in a two-terminal measurement the conductance $G_0$, and have a very small conductance once adsorption occurs. Quantum dragon sensors have embodiments that detect atoms or small molecules, such as carbon monoxide. Quantum dragon sensors also have embodiments that detect specific larger molecules, such as mercaptans found in the spray of a skunk. When either small molecules, like hydrogen sulfide, or large molecules, like mercaptans, are those a human nose can smell are detected in an electronic sensor, it is sometimes called an electronic nose. Embodiments of quantum dragon sensors include those designed to selectively measure one or more type of atom or molecule. The shape of the device, the specific locations where adsorption or docking would predominantly occur, and how specific the device is to specific types and numbers of atoms or molecules is therefore dependent on the shape of the quantum dragon device, the arrangement of atoms in the quantum dragon device, and/or the electric and/or magnetic fields applied to the device. Embodiments of quantum dragon sensors of all shapes, atomic arrangements, and/or applied electric and/or magnetic fields are encompassed by the invention.

Quantum Dragon Nanodevices Based On Carbon and 2D Graphs with Prescription 4

Nanodevices based on 2D hexagonal lattices are common today. They include materials and devices predominantly made of carbon, including graphene and carbon nanotubes. This aromatic character of carbon-carbon bonding is a material wherein the tight binding model described herein is an excellent model, and leads for example to interesting electrical conductance [Ulcakar 2019]. One can consider all hopping terms to be associated with the carbon-carbon bond, and all be identical. The on site energies may also be identical. The analysis of metallic carbon nanotubes was previously described by the inventor [Novotny 2014]. Here the description is associated with carbon-based nanomaterials, but the invention includes other quantum dragon materials and devices based on other materials with an underlying 2D graph. The inventor has been able to utilize the same description and analysis methods for zigzag graphene nanoribbons [Novotny 2020], which are metallic and exhibit unit transmission as they exhibit ballistic electron transmission. Using the proper operations of prescription #4 allows a practitioner skilled in the art to design carbon-based quantum dragon nanodevices with one or more strong scattering centers.

Figure 13:
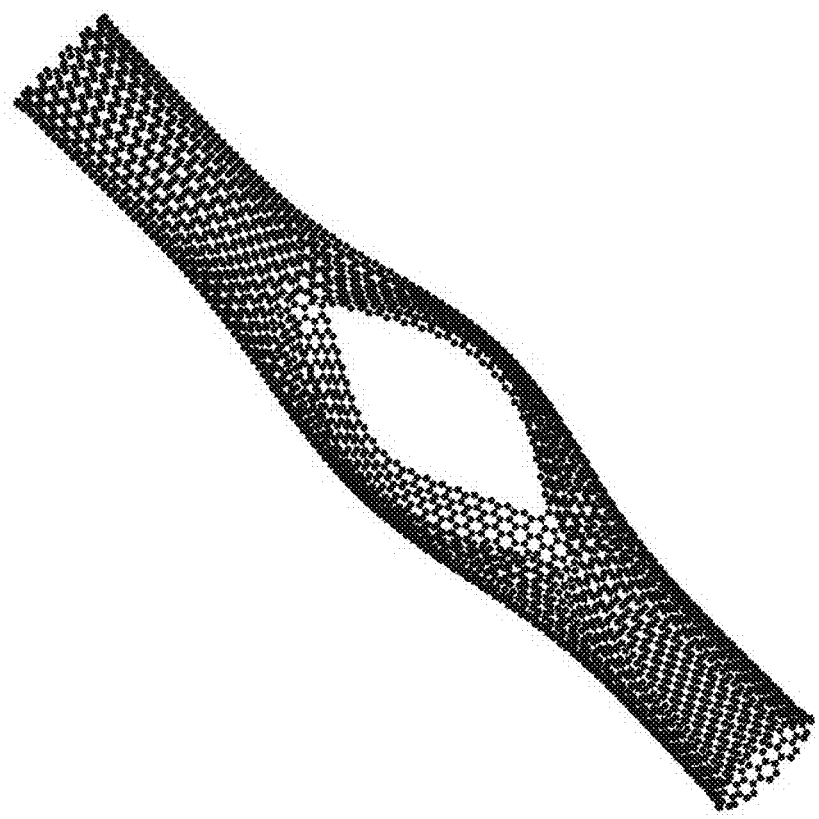
FIG. 13 depicts a partially unzipped nanotube carbon-based quantum dragon nanodevice based on a 2D hexagonal graph.

FIG. 13 shows an example of a carbon-based quantum dragon nanomaterial, formed by partially unzipping an armchair nanotube. Such partially unzipped carbon nanotubes have been synthesized by many research groups, and can be obtained from a number of experimental methods. The proper operations of prescription 4, namely cutting bonds, makes the prediction such devices should be quantum dragons and hence will have nearly unit electron transmission. In FIG. 13, the device is comprised of l=120 slices each with m=26 atoms. The two unzipping regions use proper bond cutting of bonds perpendicular to the direction of electron flow, following prescription #4. The prediction is that such partially unzipped carbon-based nanotubes will be quantum dragons with unit or nearly unit electron transmission, while conventional wisdom is that the strong scattering at the location of the unzipping would lead to a device with a very small electron transmission.

Figure 14:
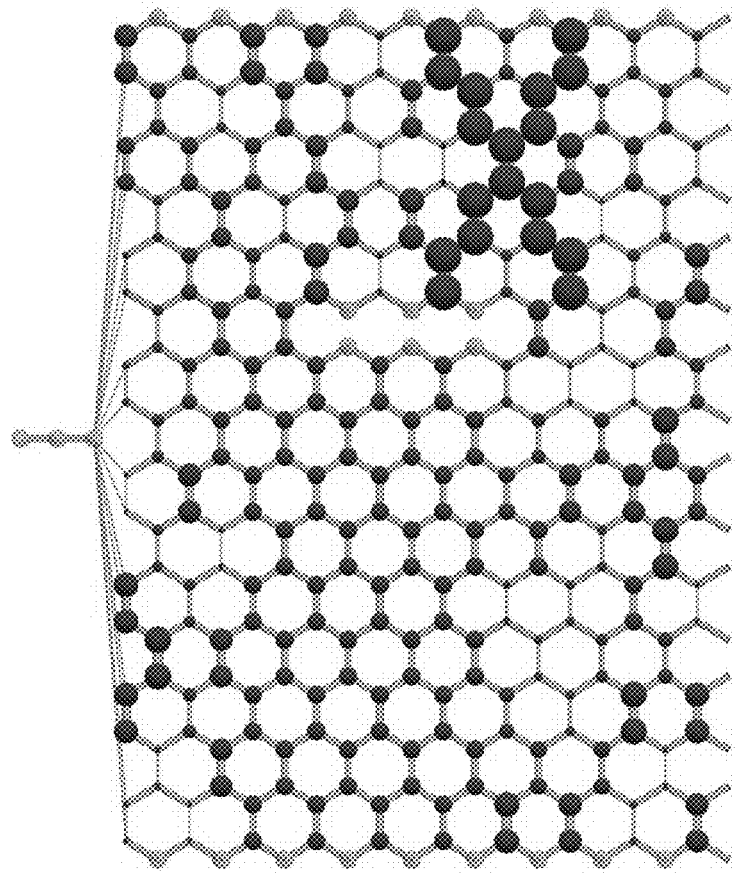
FIG. 14 depicts a portion of a quantum dragon nanodevice based on a 2D hexagonal graph with proper operations of cutting and printing.

FIG. 14 shows the left portion of a nanodevice with strong disorder, based on proper operations of cutting and printing starting with a zigzag nanoribbon. Graphene in a zigzag nanoribbon arrangement is known to have ballistic electron propagation and hence unit or near unit electron transmission. In FIG. 14, only the left-most 19 slices, each with m=16 atoms, is shown. In FIG. 14, the radii of the [cyan] cylinders are proportional to the hopping strength, which is taken to be the same for all inter-slice bonds but random for all intra-slice bonds. The exceptions to the random intra-slice bonds are the stronger bonds imprinting the 'X' and the three bonds with partial unzipping just below the 'X'. In FIG. 14, the radii of the [red] spheres are proportional to the on site energy, while atoms without any intra-slice bonds are depicted by [yellow] spheres with a common radius. FIG. 14 demonstrates that every intra-slice bond in the 2D hexagonal graph can have a different weight, may even be cut, and still the device is a quantum dragon with unit transmission.

Figure 15:
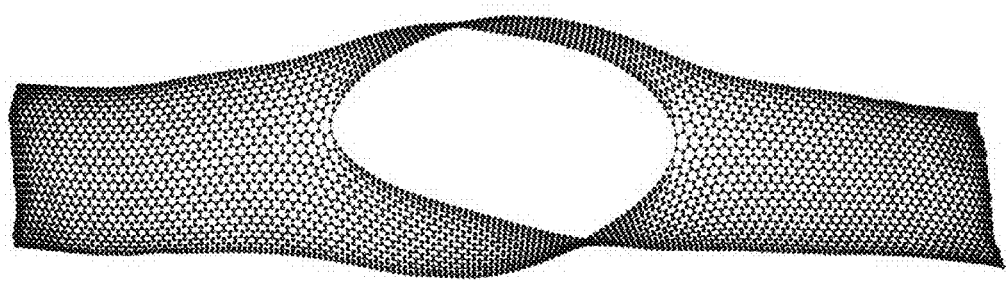
FIG. 15 depicts a quantum dragon nanodevice based on a 2D hexagonal graph with proper cutting and twisting operations to form a Möbuis strip nanodevice.

FIG. 15 shows the effects of proper cutting and twisting to form a nanodevice with a Möbius strip structure. This nanodevice is comprised of l=200 slices each with m=26 atoms. The quantum dragon nanodevice of FIG. 15 may be devised by a practitioner skilled in the arts by starting with a zigzag nanoribbon which is known to have ballistic electron propagation. The proper cutting and proper twisting of the two ribbons formed by the cut lead to a Möbius strip quantum dragon. For such a carbon-based device, the strength of every bond present can be identical and the on site energies are only those associated with a zigzag graphene nanoribbon. The twisting can also introduce an extra phase to bonds in the twisted ribbons due to the overlap of the pi orbitals of carbon. Nevertheless, unexpectedly due to the strong scattering at the cut, the device in FIG. 15 is a quantum dragon and hence has unit transmission. The small differences in the bond strengths introduced by the cutting and twisting yields a device that is nearly a quantum dragon, in that the transmission is above about 50%. The ability to form Möbius quantum dragon nanodevices makes their use as a sensor much more sensitive than a zigzag graphene nanoribbon.

Figure 16:
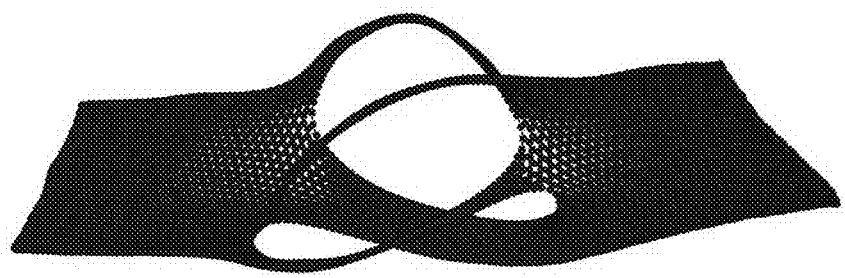
FIG. 16 depicts a tatty quantum dragon nanodevice based on a 2D hexagonal graph ribbon with proper cutting, braiding, stitching, and twisting operations.

FIG. 16 shows an example of a tatty quantum dragon based on proper cutting, twisting, braiding, and stitching from a zigzag nanoribbon based on a carbon device. This nanodevice is comprised of l=200 slices each with m=30 atoms. It is known theoretically and experimentally that a zigzag carbon nanoribbon is metallic and exhibits ballistic electron propagation and hence unit electron transmission. Performing cuts, braids, and twists to such a nanotube introduces scattering centers and hence the propagation is no longer ballistic. Nevertheless, as in FIG. 16, with proper operations described in prescription #4 the device is a quantum dragon and has unit transmission of electrons. For such a carbon-based device, the strength of every bond present can be identical and the on site energies are only those associated with a zigzag graphene nanoribbon. The ability to form complicated quantum dragon nanodevices makes their use as a sensor much more sensitive than a uniform zigzag graphene nanoribbon.

Figure 17:
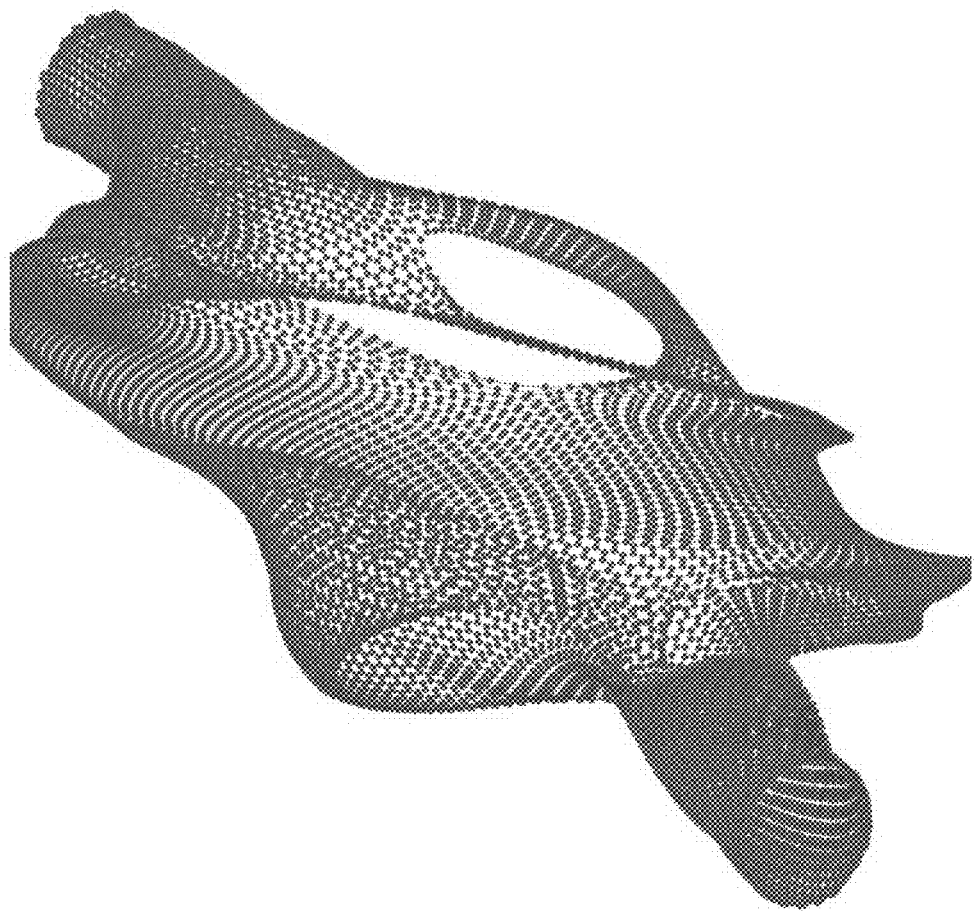
FIG. 17 depicts a tatty quantum dragon nanodevice based on a 2D hexagonal nanotube graph with proper cutting, braiding, stitching, and twisting operations.

FIG. 17 shows an example of a tatty quantum dragon based on proper cutting, twisting, braiding, and stitching from an armchair single-walled nanotube based on a carbon device. This nanodevice is comprised of l=300 slices each with m=50 atoms. It is known theoretically and experimentally that an armchair single-walled carbon nanotube is metallic and exhibits ballistic electron propagation and hence unit electron transmission. Performing cuts, braids, and twists to such a nanotube introduces scattering centers and hence the propagation is no longer ballistic. Nevertheless, as in FIG. 17, with proper operations described in prescription #4 the device is a quantum dragon and has unit transmission of electrons. For such a carbon-based device, the strength of every bond present can be identical and the on site energies are only those associated with a zigzag graphene nanoribbon. The ability to form complicated quantum dragon nanodevices makes their use as a sensor much more sensitive than a carbon single walled armchair nanotube.

Although the device examples in FIGS. 13 through 17 are based on 2D hexagonal graphs, the disclosure herein also encompasses quantum dragon nanodevices based on 2D rectangular or 2D square-octagonal graphs or combinations of any of these 2D graphs. A more detailed study of 2D quantum dragons based on rectangular graphs is in [Inkoom 2018]; however, the disclosure herein allows for proper operations as in prescription 4 that requires only local proper operations whereas [Inkoom 2018] requires global (corresponding to the number of atoms in a slice) disorder correlations.

Quantum Dragon Nanodevices Based on 3D Graphs with Prescription 4

Figure 18:
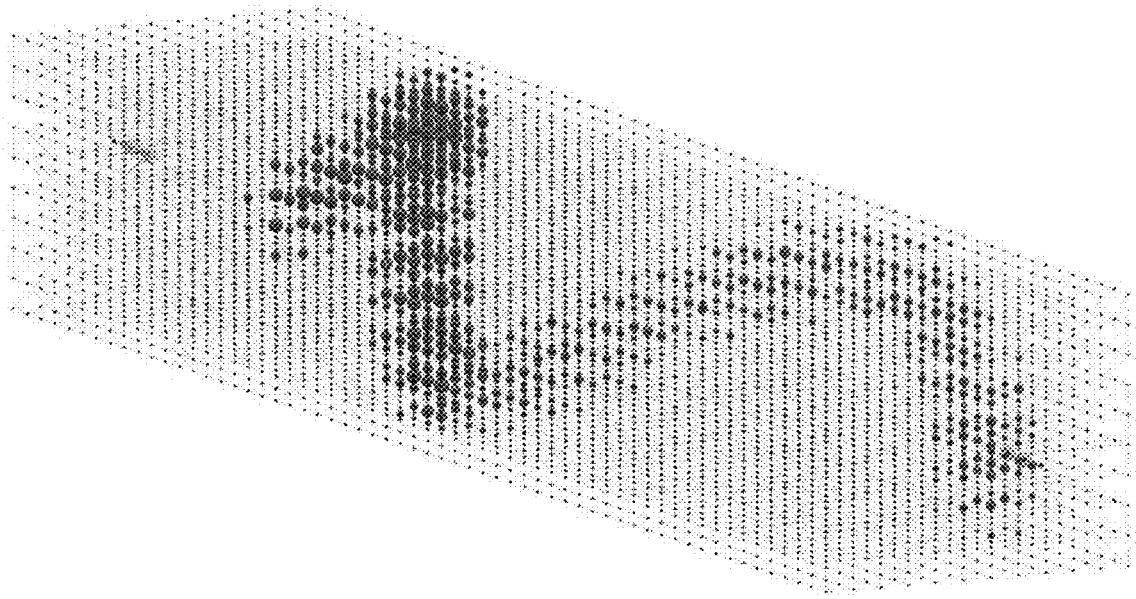
FIG. 18 depicts a quantum dragon nanodevice based on a 3D graph with proper printing and cutting operations.

It is disclosed herein that quantum dragon materials and devices can be based on underlying 3D graphs with proper operations of prescription 4. FIG. 18 shows a quantum dragon with an underlying 3D rectangular graph in the left-hand side of the figure and a 3D hexagonal graph in the right-hand side of the figure. Only the on site energies are shown, with the radii proportional to size of the spheres. The red spheres depict regions where the proper printing operation was used to make the on site energies larger. This 3D quantum dragon nanodevice is comprised of l=60 slices each with m=120 atoms. The atoms in each slice are arranged in a 2D graph being 10×12 in size. Even with this strong disorder, the device is a quantum dragon with unit electron transmission. The ability to form complicated 3D quantum dragon nanodevices makes their use as a FET, sensor, or electron spin polarized injector or spin polarized nanodevice much more sensitive and functional than ones based only on ordered 3D lattices.

Quantum Dragon Nanodevices Based on Combination 2D+3D Graphs with Prescription 4

Quantum dragon nanomaterials and devices based on 2D+3D graphs are disclosed, with proper operations of prescription 4.

Figure 19:
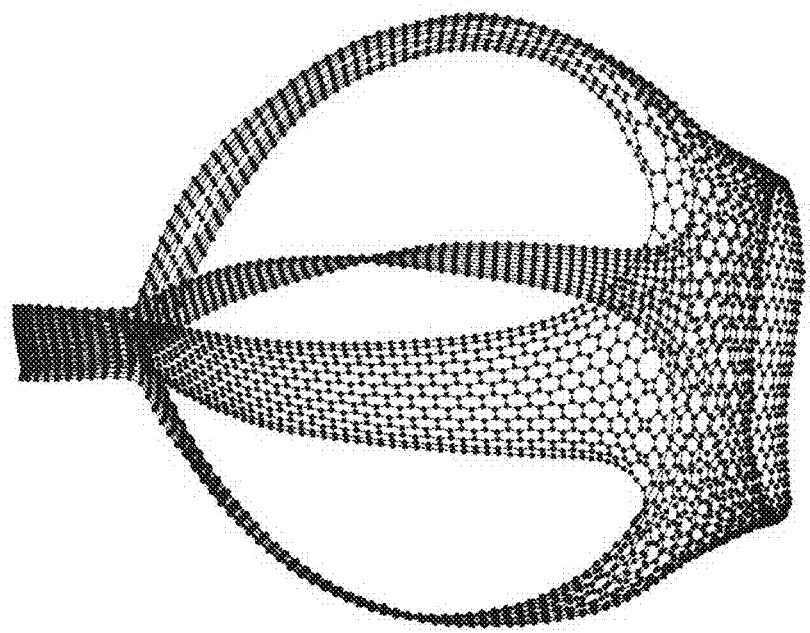
FIG. 19 depicts a quantum dragon nanodevice based on a 2D+3D graph with a constant number of atoms in each slice, with proper cutting, braiding, stitching, and twisting.

FIG. 19 shows a quantum dragon nanodevice with the left-hand portion based on a 3D hexagonal graph, the middle portion based on nanoribbons with 2D hexagonal and rectangular and square-octagonal graphs, and the right portion based on an armchair nanotube. The quantum dragon nanodevice of FIG. 19 is comprised of l=82 slices each with m=50 atoms.

Figure 20:
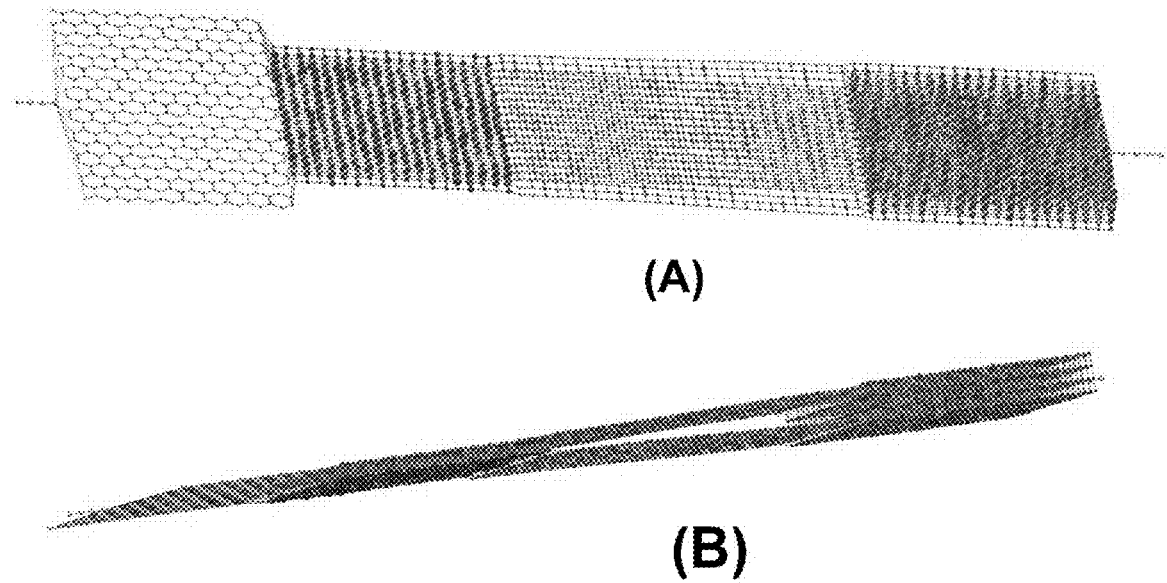
FIG. 20 depicts two views, (A) and (B), of a quantum dragon nanodevice based on a 2D+3D graph with a varying number of atoms in each slice, with proper cutting, printing, and twisting.

FIG. 20 shows two different views of a quantum dragon nanodevice based on 2D+3D graphs, having a different number of atoms in various slices. The quantum dragon nanodevice of FIG. 20 is comprised of l=86 slices. The graph is comprised of four different regions. Reading from the left-hand side, the first region is based on a 2D hexagonal graph related to a zigzag nanoribbon of graphene, but with some intra-slice bonds cut and varying hopping strengths of the remaining intra-slice bonds. The left-most region has 18 atoms in every slice. The next region is a bi-layer system with 36 atoms in every slice, based on a disordered simple cubic lattice. The third region is formed from two ribbons formed from 2D rectangular graphs with some cut intra-slice bonds, and each slice has 18 atoms from each ribbon. The right-most region is a four-layer system from a 3D hexagonal graph, with some added disorder in the intra-slice hopping terms. The total number of atoms in the nanodevice is N=3456. Even though the device is composed of different 2D and 3D disordered graphs, the entire device is a quantum dragon with unit electron transmission.

The ability to form complicated 2D+3D quantum dragon nanodevices makes their use as a FET, sensor, or electron spin polarized injector or spin polarized nanodevice much more sensitive and functional than ones based only on ordered 2D or ordered 3D lattices. Furthermore, it is disclosed that such quantum dragon nanodevices can have one region that is or acts as a sensor, another that is or acts as an FET, and another that is or acts as a perfectly conducting wire, and these regions can be combined in any combination into an integrated circuit nanodevice. This integrated circuit nanodevice can be a quantum dragon with unit transmission, or nearly a quantum dragon with greater than about 50% transmission. The ability to make an integrated circuit nanodevice is enabled by having a very small electrical resistance in the nearly quantum dragon nanodevices, thereby enabling functioning of the device without a large applied electric voltage.

The invention encompasses electrical devices as described herein and comprising in whole or in part at least one quantum dragon material, wherein the quantum dragon device consists of carbon and/or other elements that are silicone-based that allow for zigzag nanoribbons and armchair nanotubes based on a 2D hexagonal graph with disorder in the graph and/or the Hamiltonian of the device and wherein the disorder can be described by or is by proper operation(s) of cutting, twisting, stitching, printing, bond moving, braiding, or a combination thereof of these proper operations, starting from the case of zero disorder.

Further, the invention encompasses FETs as described herein and comprised of an electrical device comprising in whole or in part at least one quantum dragon material, wherein the quantum dragon material is based partly on 3D graphs and partly on 2D graphs forming ribbons or tubes. The 2D graphs may be square-octagonal, rectangular, or 2D hexagonal, with proper operations of cutting or moving bonds. The 3D graphs may be simple cubic or BCC or 3D hexagonal or trigonal, with proper operations of cutting or moving bonds. Such FETs may be comprised of any elements that form these types of graph structures. These elements include carbon and/or silicon which has a 2D hexagonal graph, and cobalt and manganese that form BCC graphs. The 2D and/or 3D graphs may also be comprised of alloys with any of these underlying graphs.

Still further, the invention encompasses electrical devices as described herein comprising an integrated quantum dragon nanodevice wherein one part of the nanodevice may be or act as an FET as described herein, a different part of the nanodevice may be or act as a perfectly conducting wire or lead also as described herein, a different part of the nanodevice may be or act as a spin-polarized device also as described herein, or any such combination thereof. Different parts of the nanodevice or integrated nanodevice may be comprised of any material based on 2D or 3D graphs, but nevertheless the entire nanodevice at least some time during its operation cycle has at least one portion with electron transmission equal to 100% or at least above about 50%.

Example: Embodiment(s)

The new methods of proper operations from 2D hexagonal graphs shows that practitioners have almost constructed certain quantum dragon devices. The disclosure provided uses one of the most simple quantum dragons, a nanosystem formed by partially unzipping a single-walled carbon nanotube (SWCNT). A number of research groups have synthesized partially unzipped carbon nanotubes. Researchers have measured the electron transport in SWCNTs (even ones suspended between leads) and graphene nanoribbons and found T(E)=1 transmission. No researcher has put together these two pieces, namely looking for metallic behavior in partially unzipped SWCNTs. The reason researchers have not yet put together the two pieces is that the partial unzipping introduces disorder, with the resulting coherent electron scattering due to the disorder. Hence, the expectation the transmission probability should be very small due to the scattering caused by the disorder. However, proper operations allow a carbon-based quantum dragon device to be metallic, even with the added disorder. For at least the last ten years, such simple devices have been synthesized and the transmissions also have been measured. FETs from the ballistic carbon nanodevices have been made, using the T(E)=1 property. The present invention provides methodologies and the motivation to put these two concepts or things together, for example to obtain quantum dragon FETs. The same can be said for sensors which have been made from carbon nanomaterials; but the ability to perform proper operations of the invention and keep the T(E)=1 property or T(E)>50% enhances the capabilities of someone skilled in the art. The invention provides the flexibility to perform proper operations and to keep or retain the unit transmission property, which are the novel features of the invention that are not currently available in any other technology.

The disclosure allows for very simple carbon devices that are quantum dragons. The disclosure provides methods and devices so that one skilled in the art can utilize known ability and materials to create new FETs and sensors, for example, from ballistic SWCNTs and graphene to make similar devices from quantum dragon nanomaterials. The disclosure describes the difference between ballistic devices, which have an underlying regular graph, and regular Hamiltonian and quantum dragons that have underlying disordered graphs and disordered Hamiltonians. Ballistic devices can be analyzed using Bloch wavefunctions and band structure methods, while quantum dragons cannot be analyzed using these methods that require translational invariance. The observed outcomes have been the experimentally observed T(E)=1 behavior for the special disorder-free devices of regular graphene nanoribbons and SWCNTs.

Existing nanodevices that are metallic have a great deal of disorder. The invention enables those skilled in the art how to make and use quantum dragon nanodevices in the same way they could use ballistic nanodevices. However, the new quantum dragon nanodevices have the ability to have many different shapes and underlying disordered graphs, thereby increasing the functionality of the devices.

The method of connecting macroscopic electron reservoirs to SWCNTs and graphene is well-established and gives approximately T(E)=1 for pure systems that have ballistic propagation. The same methodology can be used to connect quantum dragon nanodevices comprised of carbon, such as those depicted in FIGS. 13, 14, 15, 16, and 17.

For the FETs of FIGS. 10 and 11 and sensor of FIG. 12, the connections are easily made by the traditional method of depositing a metal to encapsulate a part of a nanodevice. In these figures, the 'hour-glass' or 'figure-eight' shape makes it easy to deposit the connections over one part of the 'figure-eight'. The connection will not be exactly as required for a quantum dragon, but will be nearly a quantum dragon. Nevertheless, the transmission can change precipitously as in FIGS. 10 and 11, even for devices constructed from imperfect connections. Alternatively, the methods of scanning tunneling microscropy can be used to form the connections.

For SWCNTs, the T(E)=1 ballistic property has been measured for carbon tubes with diameters from a few nm to about a hundred nanometers and lengths between a few nm to a few microns. Therefore, for the new carbon dragon nanosystems described herein, the expected dimensions are the same and this has been confirmed by recent calculations comparing ballistic SWCNTs directly with even very complicated quantum dragon nanodevices as in FIG. 16 and FIG. 17.

For the FET and sensor of FIGS. 10, 11, and 12, the equipment to fabricate includes a method to deposit a nanocrystal onto an insulating substrate such as a silicon wafer. The 'figure-eight' form can then be obtained by ablating material from the middle by use of a laser or an ion or electron etching method.

To create a simple quantum dragon FET or sensor for the simplest quantum dragon, one needs to form a partially unzipped carbon nanotube as in FIG. 13 by using known methods and then attach leads for the SWCNTs by known methods.

For the FET and sensor of FIGS. 10, 11, and 12, a practitioner needs to deposit a nanocrystal onto an insulating substrate, such as a silicon wafer. The 'figure-eight' form can then be obtained by ablating material from the middle by use of a laser or an ion or electron etching method. The leads can then be deposited by encapsulating one part of the 'figure-eight' with a good metal, such as gold for example.

Alternatively in both cases the methods of scanning tunneling microscropy can be used to form the connections once the nanomaterial is formed.

Figure 21:
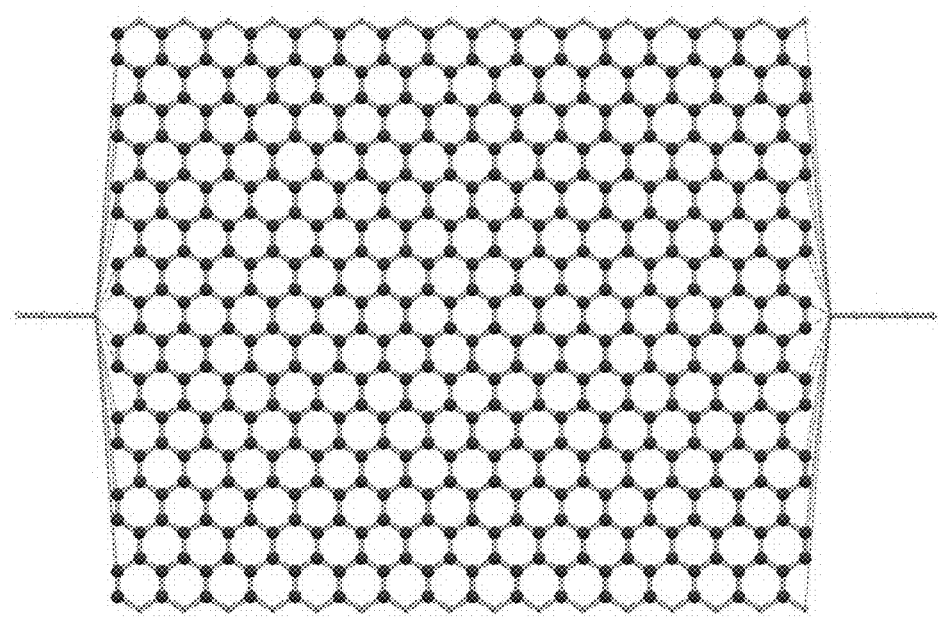
FIG. 21 depicts a zigzag graphene nanoribbon and the metallic behavior for ballistic electron propagation that requires two different on site energies, one for atoms with an intra-slice bond (red) and one for atoms without an intra-slice bond (yellow).

The new proper operations accomplish the tuning via normal physical processes. This is the same basis for tuning to make pure SWCNT or graphene nanomaterials. In these cases, all the hopping strengths have unit energy (taking the unit of energy as the 2D hexagonal pi-pi bond overlap, which is the same for all such carbon-carbon bonds). For a SWCNt, all on site energies can be taken to be those of carbon in the applied electric potential. For a zigzag graphene nanoribbon, the metallic behavior for ballistic electron propagation requires two different on site energies as in FIG. 21, one for atoms with an intra-slice bond (red) and one for atoms without an intra-slice bond (yellow). Thus, nature naturally tunes the formation of zigzag graphene nanoribbon to the parameters which gives T(E)=1. The quantum dragon nanodevices in FIGS. 13, 15, 16, and 17 all have the same values for the hopping bonds to be exactly equal (as in a SWCNT or graphene) and have the on site energies just the two values needed to make a zigzag graphene nanoribbon have T(E)=1. Thus, just synthesizing the devices as in those figures means nature does the tuning automatically since all carbon atoms are the same and all pi-pi bonds of carbon are the same. Of course, the pi-pi bonds (the hopping t, in the tight binding model) will be slightly different due to the small distortions due to twisting, cutting, stitching, and/or braiding, but this provides the device to be nearly a quantum dragon. Although quantum dragons can have a great deal of disorder, as in FIG. 14, it is not necessary to have a great deal of disorder, so that one can allow nature to do the tuning consistently.

Based on the 2D hexagonal graphs for carbon-based quantum dragons, one does not have to understand quantum physics. Rather, one only has to understand that proper operations of the invention can be done and the devices will still have T(E)=1 if one starts from a regular graph as a SWCNT or regular graphene, as in FIG. 21. Thus, for any synthesized carbon device a practitioner only need ask whether the proper operations can be used to take a regular 2D hexagonal graph as in FIG. 21 to one of the quantum dragon graphs as in FIGS. 13-17. Many synthesis methods used for carbon nanotubes and buckeyballs, such as arc discharge, produce many different types of tube-like carbon structures. Selecting the structures that would be quantum dragons as in FIGS. 15, 16, and 17 would enable one who understands the proper operations of the invention to obtain a quantum dragon nanodevice of the invention.

It is possible today to utilize purifying techniques to provide high purity of metallic nanotubes. Purifying techniques can be used to purify metallic carbon dragon nanomaterials from carbon nanomaterials that are not metallic.

For the devices as in FIGS. 13 through 17, the material needed is carbon. The dimensions are about those currently used for today's graphene nanoribbons and SWCNTs. The tube-like structures of the invention have the number of atoms in a slice ranging from about six to about a hundred, with the number of slices ranging from about four to tens of thousands. This corresponds roughly to the same dimensions as a SWCNT. A SWCNT has the radius of the tube to be from about three nanometers to a few tens of nanometers, or a 'collapsed' larger nanotube would correspond to a diameter of a few hundred nanometers. The lengths of the tube-like structures can range from short, or a few tens of nanometers, to long, namely a few microns. SWCNTs with these dimensions have been known since at least about 2003. The same approximate dimensions are those of the devices shown in FIGS. 2, 4, 5, 6, 7, 10, 11, and 12. Generally, the direction along which the electrons flow can be short, as a few tens of nm, to very long, as in even tens of microns. The widths perpendicular to the direction of electron flow would correspond to between a few nm to a few hundred nm.

Example: Implementation(s)

Figure 22:
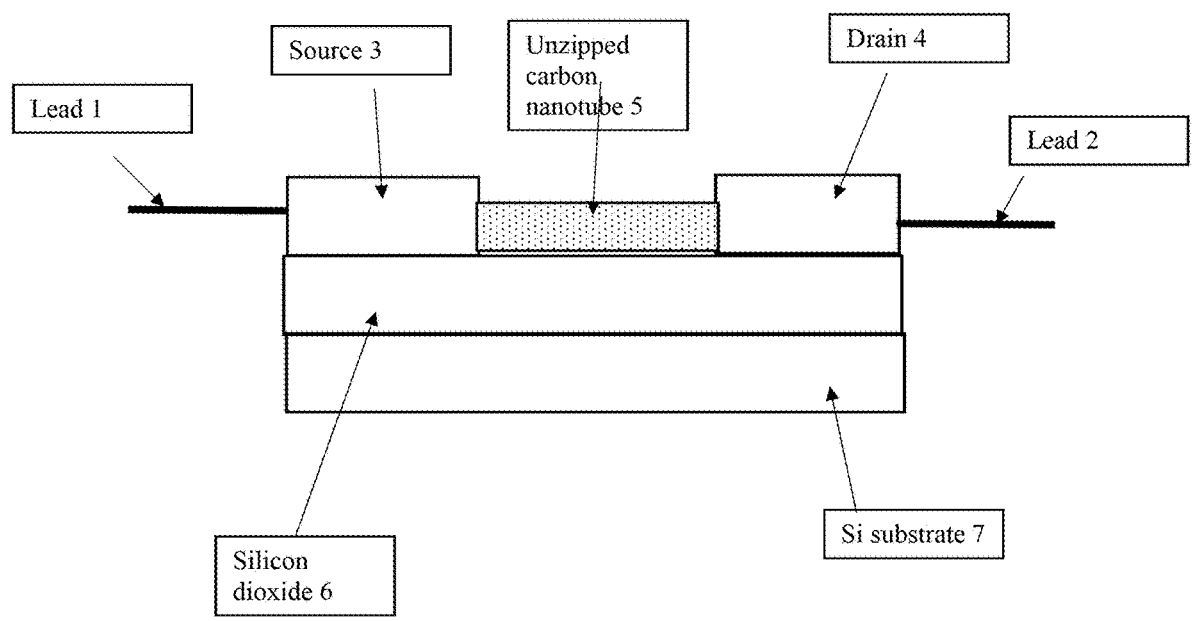
FIG. 22 depicts one method for making a quantum dragon field effect transistor of the invention.

One method for making a quantum dragon field effect transistor of the invention, for example, is shown in FIG. 22. Lead 1 is an input lead and Lead 2 is an output lead. The source 3 is connected electrically to the input Lead 1 and the Drain 4 is connected to the output Lead 2. The unzipped carbon nanotube 5 is between the Source 3 and Drain 4. The silicon dioxide 6 and Si substrate 7 together form the base of the device, positioned as shown in the figure wherein the silicon dioxide 6 is connected to the Source 3 and Drain 4 and the Si substrate 7 is connected to the silicon dioxide 6, also as shown. Note that in FIG. 22, the unzipped carbon nanotube 5, which may be a partially unzipped nanotube, may be deposited on the silicon dioxide 6 and Si substrate 7 or, as is shown in the figure, it may be suspended above the silicon dioxide 6 and Si substrate 7.

An arc process can be used to create carbon quantum dragon devices. Carbon nanotubes can be used that have been refined to have a high purity of metallic nanotubes, wherein $T(E)=$. Some of the same types of purification methods used for metallic nanotubes should likewise apply for metallic quantum dragon nanotubes, since some of the purification processes are tied to the metallic nature of the nanotube itself.

Step 1. Using a Known Method, Create a Partially Unzipped Single Wall Carbon Nanotube.

Form a partially unzipped carbon nanotube (as in FIG. 13) by one of several methods. In one method, the outer layer of single wall carbon nanotubes are unzipped via scanning tunneling microscope ("STM") manipulation, for example. The tip of an STM is placed in close proximity to a carbon nanotube and energized. Interaction between the STM tip and the carbon nanotube causes a cycloaddition reaction between carbon atoms in the nanotube, disrupting the bonds between the carbon atoms and splitting, or unzipping, the wall of the carbon nanotube.

Alternatively, unzipped carbon nanotubes may be formed by oxidizing carbon nanotubes with potassium permanganate and sulfuric acid, for example, to weaken and break some carbon-carbon bonds of the nanotube. Another method of creating unzipped carbon nanotubes can include creating a solution of carbon nanotubes and exposing the solution to a high energy ultrasonic tip. Addition of ultrasonic energy into the carbon nanotube solution breaks carbon-carbon bonds in the nanotubes, splitting or "unzipping" them.

Step 2. Deposit the Partially Unzipped Carbon Nanotube onto a Wafer, or Suspend it Above a Trench Between a Source and Drain of Electrons.

For deposition, partially unzipped carbon nanotubes are placed into a solution. The solution may comprise a solvent such as dichlorethane, dimethylformamide, or tetrahydrofuran. The solvent is applied to a semiconductor material using typical semiconductor production processes, such as dipping, spincoating, or similar processes.

Step 3. Remove Materials.

After the semiconductor material is coated with unzipped carbon nanotubes, any unwanted material is removed from the coated wafer to form the source and drain electrodes for transistors. Methods such as laser ablation, electron etching, lithography, or other semiconductor production techniques may be used to remove unwanted materials. Partially unzipped carbon nanotubes remain on the substrate and form channel structures between the source and drain electrodes. Conductors, such as gold, may be deposited onto the semiconductor substrate to serve as leads for the transistor source and drain electrodes.

All parameters presented herein including, but not limited to, sizes, dimensions, times, temperatures, pressures, amounts, distances, quantities, ratios, weights, volumes, percentages, and/or similar features and data and the like, for example, represent approximate values, i.e., "about", unless specified otherwise, and can vary with the possible embodiments described and those not necessarily described but encompassed by the invention. For example, a description of "less than 1%" means less than about 1% and "greater than 50%" means greater than about 50%. Unless defined otherwise, all technical and scientific terms used herein have the same meaning as commonly understood to one of ordinary skill in the art to which this invention belongs. Further, references to the singular forms "a", "an", and "the" concerning any particular item, component, material, or product include plural references and are defined as at least one and could be more than one, unless the context clearly dictates otherwise. The terminology employed is for the purpose of describing particular embodiments and is not intended to be limiting in any way.

The above detailed description is presented to enable any person skilled in the art to make and use the invention. Specific details have been revealed to provide a comprehensive understanding of the present invention, and are used for explanation of the information provided. These specific details, however, are not required to practice the invention, as is apparent to one skilled in the art. Descriptions of specific applications, analyses, and calculations are meant to serve only as representative examples. Various modifications to the preferred embodiments may be readily apparent to one skilled in the art, and the general principles defined herein may be applicable to other embodiments and applications while still remaining within the scope of the invention. Moreover, some features of the invention may be employed without a corresponding use of the other features. There is no intention for the present invention to be limited to the embodiments shown and the invention is to be accorded the widest possible scope consistent with the principles and features disclosed herein.

While various embodiments of the present invention have been described above, it should be understood that they have been presented by way of example and not limitation. It will be apparent to persons skilled in the relevant art(s) that various changes in form and detail can be made therein without departing from the spirit and scope of the present invention. In fact, after reading the above description, it will be apparent to one skilled in the relevant art(s) how to implement the invention in alternative embodiments. The preferred embodiments of the invention have been described herein, but it should be understood that the broadest scope of the invention includes such modifications as additional or different methods and materials. Many other advantages of the invention will be apparent to those skilled in the art from the above descriptions and the subsequent preferred embodiments and/or claims. Thus, the present invention should not be limited by any of the above-described exemplary embodiments. The compositions, materials, products, processes, apparatus, systems, methods, and devices and the methods of constructing and devising such materials and devices of the present invention are often best practiced by empirically determining the appropriate values of the operating parameters, or by conducting simulations to arrive at best design for a given application. Accordingly, all suitable modifications, combinations, and equivalents should be considered as falling within the spirit and scope of the invention.

REFERENCES

[Anantram 2006] M. P. Anantram and F. Leonard, *Reports on Progress in Physics*, vol. 69, p. 507-561 (2006).
[Anderson 1958] P. W. Anderson, *Physical Review*, volume 109, pages 1492-1505 (1958).
[Bagwell 1989] P. F. verte Bagwell and T. P. Orlando, *Physical Review B*, volume 40, pages 1456-1464 (1989).
[Büttiker 1985] M. Büttiker, Y. Imry, R. Landauer, and S. Pinhas, *Physical Review B*, volume 31, pages 6207-6215 (1985).
[Cardamone 2002] D. M. Cardamone, et al, *Nano Letters*, vol. 6, p. 4200-4201 (2002).
[Chuang 2013] S. Chuang et al, *Nano Letters*, vol. 13, p. 555-558 (2013).
[Daboul 2000] D. Daboul, I. Chang, and A. Aharony, European Physical Journal B, volume 16, pages 303-316 (2000).
[Datta 1995] S. Datta, *Electronic Transport in Mesoscopic Systems* (Cambridge University Press, Cambridge, UK, 1995].
[De Picciotto 2001] R. De Picciotto, et al, *Nature*, vol. 411, pages 51-54 (2001).
[Flores 2008]: F. Flores, et al, *Journal of Physics: Condensed Matter*, vol. 20, article 304211 [7 pages] (2008).
[Frank 1998] S. Frank, P. Poncharal, Z. L. Wang, and W. A. de Heer, *Science*, volume 280, pages 1744-1746 (1998).
[Hamada 1992] N. Hamada, S. Sawada, and A. Oshiyama, *Physical Review Letters*, volume 68, pages 1579-1581 (1992).
[Hirose 2014] K. Hirose and N. Kobayashi, *Quantum Transport Calculations for Nanosystems* (Pan Stanford Publishing, Singapore, 2014).
[Inkoom 2018] G. Inkoom and M. A. Novotny, *Journal of Physics Communications*, volume 2, article 115019 [22 pages] (2018).
[Kong 2001] J. Kong, et al, Physical Review Letters, volume 87, article 106801 [4 pages](2001).
[Landauer 1957] R. Landauer, *IBM Journal of Research and Development*, volume 1, pages 223-231 (1957).
[Lagendijk 2009] A. Lagendijk, et al, *Physics Today, pages 24-29 (August 2009).
[Lee 1985] P. Lee and D. S. Fisher, *Physical Review Letters*, volume 47, pages 882-885 (1985).
[Li 2015] Z. Li, *Multi-channel quantum dragons in rectangular nanotubes*, M.S. thesis, Mississippi State University, May 2015.
[Liu 2013] L. Liu, J. Gao, X. Guo, and J. Zhao, Physical Chemistry Chemical Physics, volume 15, article 17134 [8 pages] (2013).
[Novotny 2015] M. A. Novotny, *Physical Review B*, volume 90, article 165103 [14 pages](2014), including the supplemental material [67 pages].
[Novotny 2015] M. A. Novotny, preprint http://arXiv.org/abs/1502.07814 [14 pages].
[Novotny 2020] M. A. Novotny and T. Novotny, preprint https://arxiv.org/pdf/2007.01051 [29 pages].
[Ulcakar 2019] L. Ulčakar, et al, *Scientfic Reports*, volume 9, article 3478 [11 pages] (2019).
[Wu 2011] Y. Wu and P. A. Childs, *Nanoscale Research Letters*, 6:62 [5 pages] (2011).
[Zutic 2004] I. Zutic, J. Fabian, and S. Das Sarma, *Reviews of Modern Physics*, volume 76, pages 323-410 (2004).

What is claimed is:

1. A method for devising an electrical device, the method comprising:
   connecting a quantum dragon material with a correlated disorder to at least one input lead and at least one output lead to enable a transmission probability of electrons through the electrical device as a function of energy above fifty percent at any point during an operation cycle of the electrical device without ballistic electron propagation.

2. The method of claim 1, wherein the quantum dragon material is a structure that comprises at least one optoelectronic device, wire, electronic sensor, optoelectronic sensor, spin-polarized injector, spin-polarized current device, or field-effect transistor, wherein the structure operates at a region of parameter space so that a total quantum electron transmission probability is equal to one for a range of electron energies, wherein the electrons flowing through the structure do not undergo ballistic propagation, and wherein there are propagating modes of the electrons along the at least one input lead and the at least one output lead of the electrical device.

3. The method of claim 1, wherein the electrical device provides a four-terminal measurement of electrical resistance equal to zero at any point during the operation cycle of the electrical device.

4. The method of claim 1, wherein the electrical device provides a two-terminal measurement of electrical conductance equal to, or integer multiples of, a quantum of conductance, and wherein a device symmetry or a device proportion matches a symmetry or proportion of the at least one input lead and the at least one output lead of the electrical device.

5. The method of claim 1, the at least one input lead and the at least one output lead have a same slice-to-slice parameter ratio as the quantum dragon material so that the quantum dragon material acts as a perfect conductor with zero resistance and has conductance near integer, or half integer, multiples of a quantum of conductance associated with unit electrical transmission for a wide range of electron energies.

6. The method of claim 5, wherein the slice-to-slice parameter ratio of the at least one input lead and at least one output lead is a same as a slice-to-slice parameter ratio of the electrical device.

7. A method for devising an electrical device, the method comprising:
   obtaining at least one quantum dragon amorphous slice, at least two crystalline slices, or a combination thereof;
   connecting the at least one quantum dragon amorphous slice to at least one other quantum dragon amorphous slice;
   connecting the at least one quantum dragon amorphous slice to at least one crystalline slice;
   connecting at least two non-identical quantum dragon crystalline slices together, wherein connections form a multi-slice quantum dragon material device and the connections are made via a hopping parameter connecting one atom to another atom of a quantum dragon material slice; and connecting the multi-slice quantum dragon material device to at least one electrical lead.

8. The method of claim 1, wherein the quantum dragon material comprises at least one simple cubic (SC) crystal or nanocrystal, at least one body-centered cubic (BCC) crystal or nanocrystal, at least one three dimensional (3D) hexagonal crystal, at least one tube or nanotube with axial symmetry, at least one amorphous material, at least one face-centered cubic or other crystalline structure, or a combination thereof.

9. The method of claim 1, wherein the quantum dragon material comprises at least one simple cubic (SC) crystal or nanocrystal, and wherein the at least one SC crystal or nanocrystal comprises polonium arranged into two or more unit cells.

10. The method of claim 1, wherein the quantum dragon material comprises at least one body-centered cubic (BCC) crystal or nanocrystal, and wherein the at least one BCC crystal or nanocrystal comprises material from a group of materials consisting of lithium, sodium, potassium, iron, molybdenum, chromium, vanadium, niobium, barium, rubidium, and tantalum, arranged into two or more unit cells.

11. A method for devising an electrical device, the method comprising:

connecting a quantum dragon material with a correlated disorder to at least two electrical leads to enable a transmission probability of electrons through the electrical device as a function of energy above fifty percent at any point during an operation cycle of the electrical device without ballistic electron propagation;

tuning the electrical device by applying an electro-magnetic field to the quantum dragon material;

tuning the electrical device by altering a position of an amorphous material within the quantum dragon material;

tuning the electrical device by altering a position of at least two non-identical crystalline materials within the quantum dragon material; and tuning the electrical device by utilizing a shape of materials within the quantum dragon material, wherein the quantum dragon material comprises at least one simple cubic (SC) crystal or nanocrystal, at least one body-centered cubic (BCC) crystal or nanocrystal, at least one tube or nanotube with axial symmetry, at least one amorphous material, or combinations thereof.

12. The method of claim 1, wherein the quantum dragon material breaks internal spin-reversal symmetry via atomic substitutions or spin-orbit coupling or breaks external spin-reversal symmetry via an applied magnetic field and thereby forms a spin-polarized field effect transistor, a spin-polarized current injector device, or a combination thereof, and wherein the electrical current exiting the electrical device has a different fraction of spin-up electrons compared to a fraction of spin-down electrons.

13. The method of claim 12, wherein the electrical device is a spin-polarized device having a two-terminal measured electrical conductance equal to, or integer multiples of, one-half of a quantum of conductance, wherein a device symmetry or proportion of the electrical device matches a symmetry or proportion of the at least one input lead and the at least one output lead of the electrical device.

14. The method of claim 8, further comprising applying to the electrical device an electric field via an external electrical potential difference applied transverse to a direction of current flow that produces a change in electron transmission and current transmitted through the electrical device, wherein a shape of the quantum dragon material is non-uniform.

15. The method of claim 11, wherein the electrical device is a spin-polarized or spin-unpolarized quantum dragon electrical device.

16. The method of claim 14, wherein a shape of the quantum dragon material is associated with points in a parameter space where a change in an externally applied electro-magnetic field produces a larger change in electron transmission.

17. The method of claim 16, wherein the shape of the quantum dragon material is a dumbbell shape, an eyeglass shape, an hourglass shape, a figure-eight shape, or any shape having at least two wide cross-sections perpendicular to a direction of electric current flow and connected by at least one narrow neck connecting the at least two wide cross-sections.

18. The method of claim 1, wherein the quantum dragon material has cylindrical symmetry, a single conducting channel, or a combination thereof.

19. The method of claim 1, wherein the quantum dragon material is a single walled carbon nanotube, and wherein, during at least some portion of device operation, the electrical device has a total quantum electron transmission probability of unit transmission.

20. The method of claim 1, wherein the electrical device operates at, and electrical conductivity occurs through the electrical device, below room temperature, at room temperature, or within about one hundred degrees Celsius above room temperature.

21. The method of claim 1, wherein the electrical device can be described by a disordered weighted undirected graph having at least one vertex weight which is an on-site energy and at least one edge or bond weight which is a tight-binding hopping parameter.

22. The method of claim 21, further comprising tuning the at least one vertex weight, the at least one edge or bond weight, or both, by adjusting one or more weights thereof via tuning atomic connection strengths, applying at least one electrical potential to at least one atom in the electrical device, applying at least one magnetic potential to at least one atom in the electrical device, or any combination thereof, to produce a quantum dragon material electrical device, wherein a probability of total quantum electron transmission is unit transmission.

23. The method of claim 2, wherein the quantum dragon material undergoes a change in electrical transmission when electromagnetic radiation impinges on the electrical device, thereby making the electrical device an optoelectronic device for detecting electromagnetic radiation.

24. The method of claim 2, wherein the electrical device provides electron transmission changes when one or more atoms or molecules touch the electrical device or are physisorbed or chemisorbed to the electrical device.

25. The method of claim 1, wherein the quantum dragon material comprises carbon and silicon-based elements that allow for zigzag nanoribbons and armchair nanotubes based on a two dimensional (2D) hexagonal graph with disorder in the graph, and wherein the disorder is by operation of cutting, twisting, stitching, printing, bond moving, braiding, or a combination thereof.

26. The method of claim 8, wherein the quantum dragon material is based on three dimensional (3D) graphs and on two dimensional (2D) graphs forming ribbons or tubes, wherein the 2D graphs are square-octagonal, rectangular, or 2D hexagonal, with operations of cutting or moving bonds and the 3D graphs are simple cubic, BCC, 3D hexagonal, or trigonal, with operations of cutting or moving bonds, and wherein the quantum dragon material comprises carbon, silicon, cobalt, manganese, or alloys thereof.

27. The method of claim 1, wherein the electrical device is an integrated quantum dragon nanodevice, and wherein one part of the electrical device acts as a quantum dragon material field effect transistor (FET), a different part of the electrical device acts as a perfectly conducting wire, and a different part of the electrical device acts as a spin-polarized quantum dragon device.

28. An electrical device made by the method of claim 1.

29. The method of claim 1, further comprising tuning the electrical device by applying an electric field, a magnetic field, or both, to the quantum dragon material.

30. The method of claim 1, wherein the quantum dragon material comprises an amorphous slice, the method further comprising tuning the electrical device by altering positions of atoms of the amorphous slice and altering overlap of electrons of the atoms of the amorphous slice.

31. The method of claim 1, wherein the quantum dragon material comprises at least two non-identical crystalline slices, the method further comprising tuning the electrical device by altering positions of the at least two non-identical crystalline slices to alter positions of atoms of the non-identical crystalline slices and altering overlap of electrons of the atoms of the non-identical crystalline slices.

32. The method of claim 1, wherein the quantum dragon material comprises one or more slices, the method further comprising tuning the electrical device by utilizing a shape of any of the slices.

33. The method of claim 1, wherein the transmission probability of electrons through the electrical device as a function of energy is above eighty five percent.

34. The method of claim 1, wherein the transmission probability of electrons through the electrical device as a function of energy is one hundred percent.

* * * * *